United States Patent
Kay et al.

(10) Patent No.: US 9,614,443 B2
(45) Date of Patent: Apr. 4, 2017

(54) SMOOTH TRANSITIONING BUCK-BOOST DC-DC CONVERTER

(71) Applicant: RF Micro Devices, Inc., Greensboro, NC (US)

(72) Inventors: Michael R. Kay, Summerfield, NC (US); Manbir Singh Nag, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 67 days.

(21) Appl. No.: 14/808,119

(22) Filed: Jul. 24, 2015

(65) Prior Publication Data

US 2016/0028305 A1 Jan. 28, 2016

Related U.S. Application Data

(60) Provisional application No. 62/028,376, filed on Jul. 24, 2014.

(51) Int. Cl.
 *G05F 1/24* (2006.01)
 *H02M 3/158* (2006.01)

(52) U.S. Cl.
 CPC ................. *H02M 3/1582* (2013.01)

(58) Field of Classification Search
 CPC .. H02M 3/156; H02M 3/1582; H02M 3/1588; H02M 3/157
 USPC .......... 323/222, 259, 271, 282–285
 See application file for complete search history.

(56) References Cited

U.S. PATENT DOCUMENTS

| | | | | |
|---|---|---|---|---|
| 6,166,257 A * | 12/2000 | Mathey | ................... | C07B 53/00 546/134 |
| 7,075,277 B2 * | 7/2006 | Ishii | ................... | H02M 3/1582 323/222 |
| 8,947,157 B2 | 2/2015 | Levesque et al. | | |
| 2008/0303499 A1 * | 12/2008 | Chen | ................... | H02M 3/157 323/282 |

OTHER PUBLICATIONS

Ren, Xiaoyong et al., "Dual-Edge Modulated Four-Switch Buck-Boost Converter," 2008 IEEE Power Electronics Specialists Conference (PESC 2008), IEEE, Jun. 15-19, 2008, Rhodes, pp. 3635-3641.

* cited by examiner

*Primary Examiner* — Nguyen Tran
(74) *Attorney, Agent, or Firm* — Withrow & Terranova, P.L.L.C.

(57) ABSTRACT

A buck-boost DC-DC converter, which includes converter control circuitry, converter switching circuitry, and a first inductive element, is disclosed. The converter control circuitry provides a buck mode timing signal and a boost mode timing signal. The converter switching circuitry provides a switching output signal. During a buck mode of the buck-boost DC-DC converter, when a buck pulse-width of the switching output signal is less than a buck pulse-width threshold, the buck pulse-width is limited based on both the buck mode timing signal and the boost mode timing signal. During a boost mode of the buck-boost DC-DC converter, when a boost pulse-width of the switching output signal is less than a boost pulse-width threshold, the boost pulse-width is limited based on both the buck mode timing signal and the boost mode timing signal. The first inductive element receives and filters the switching output signal to provide a converter output signal.

20 Claims, 15 Drawing Sheets

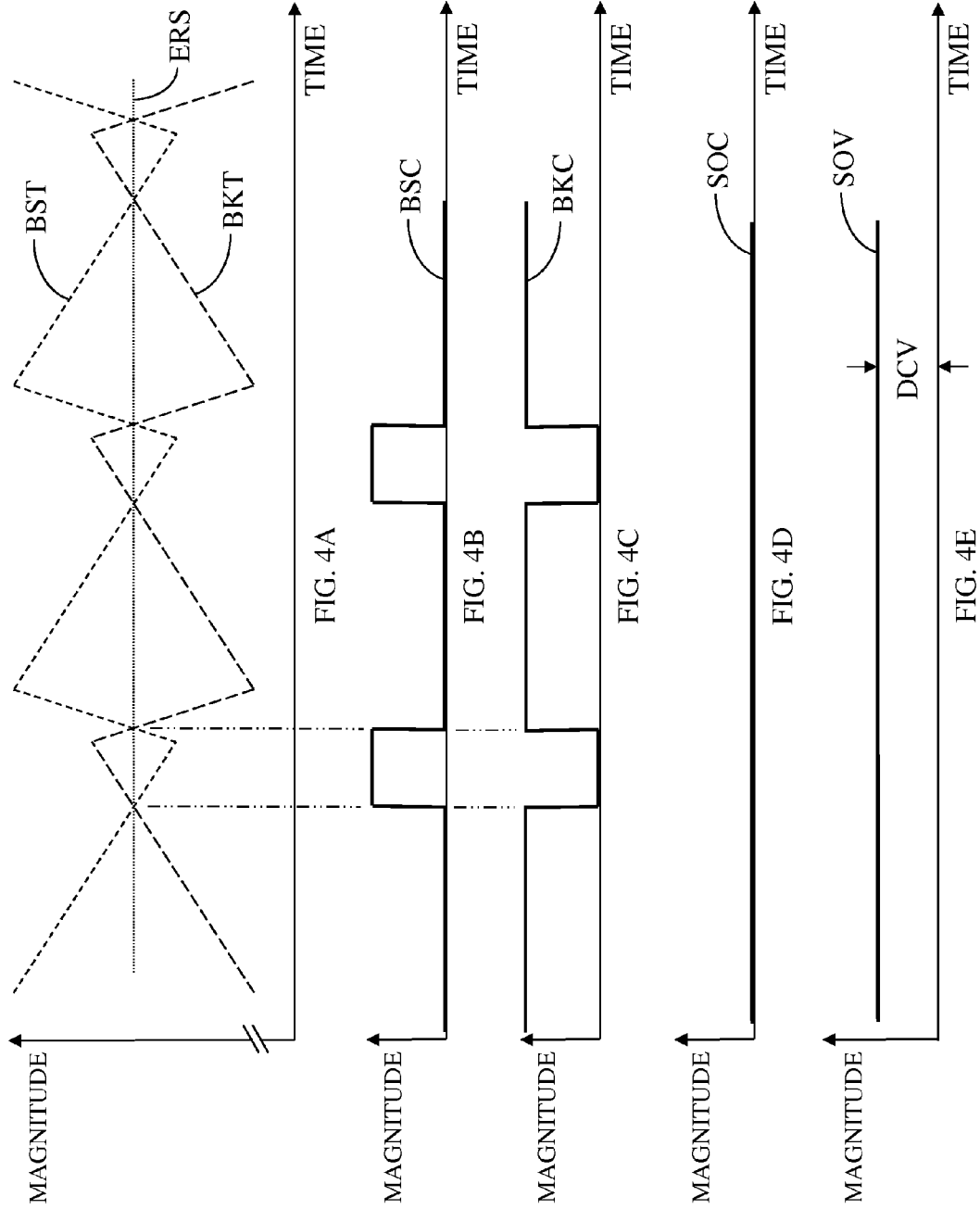

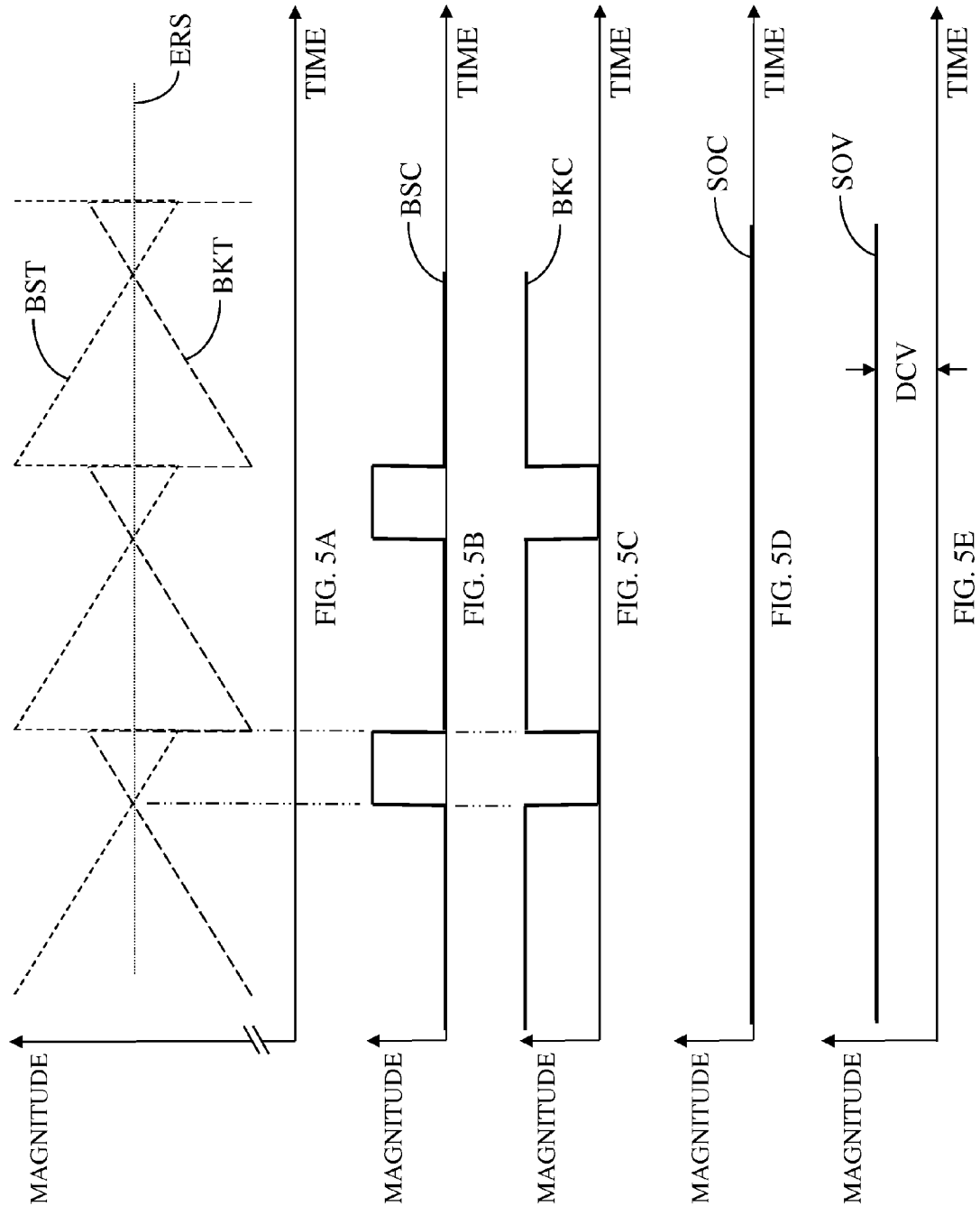

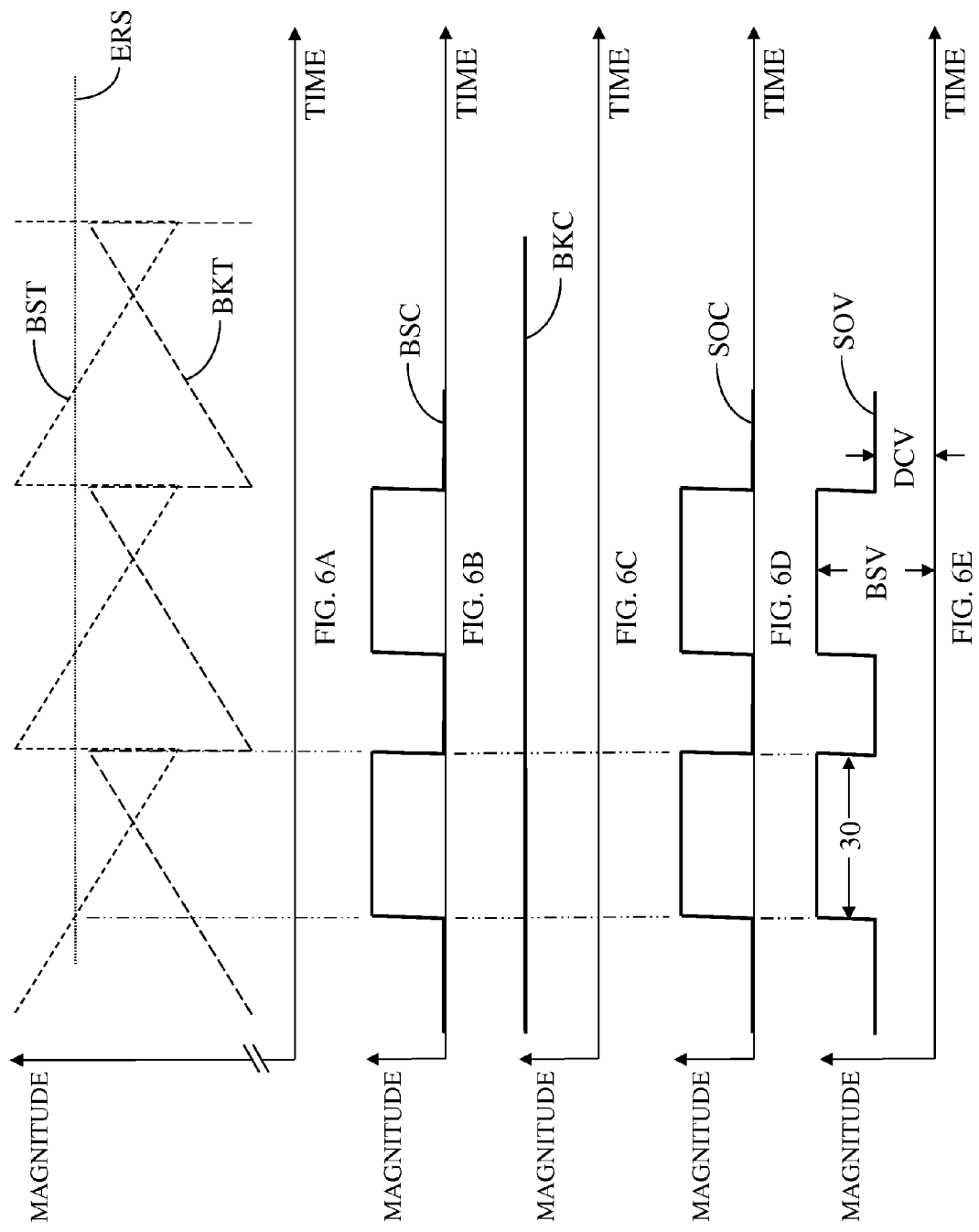

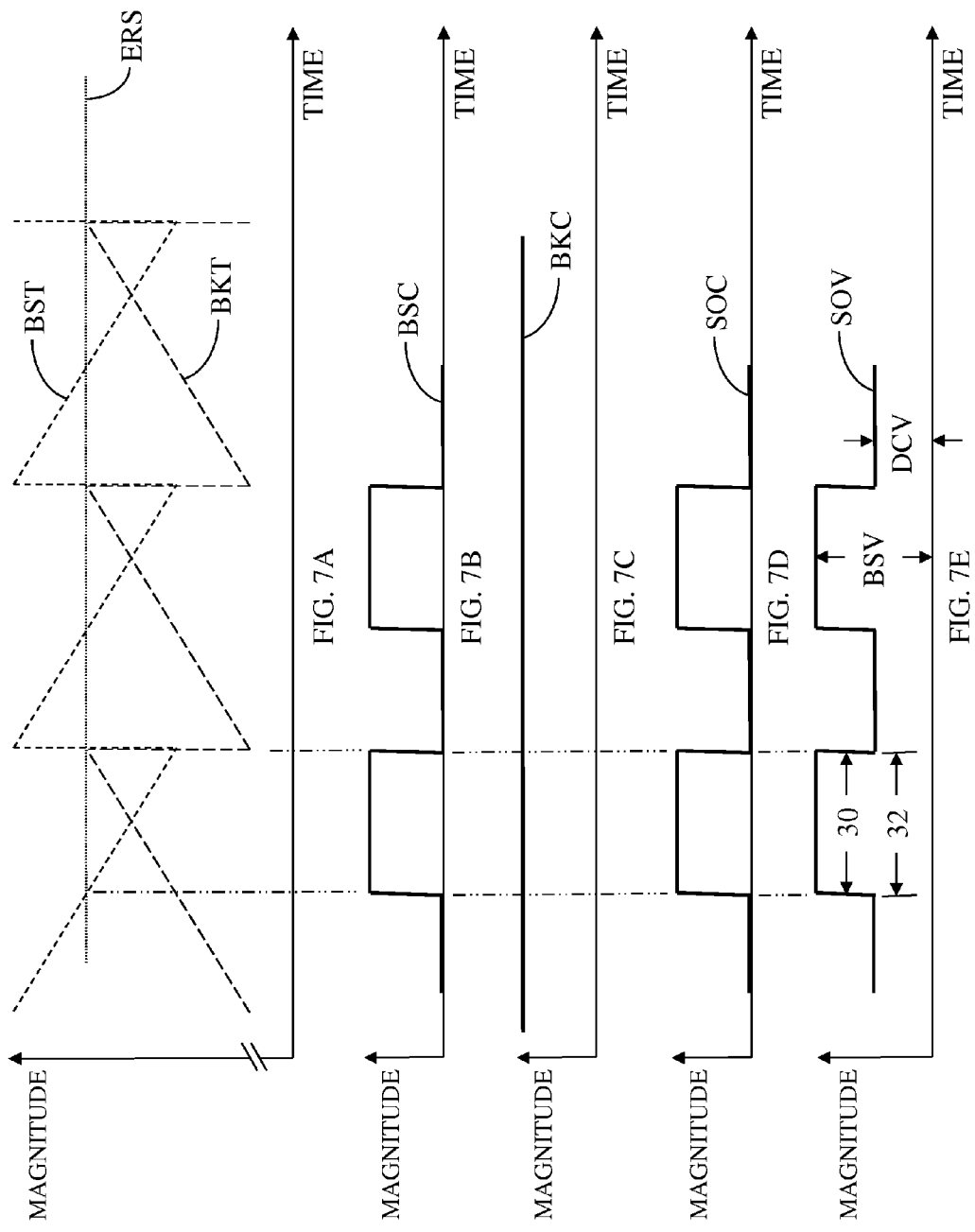

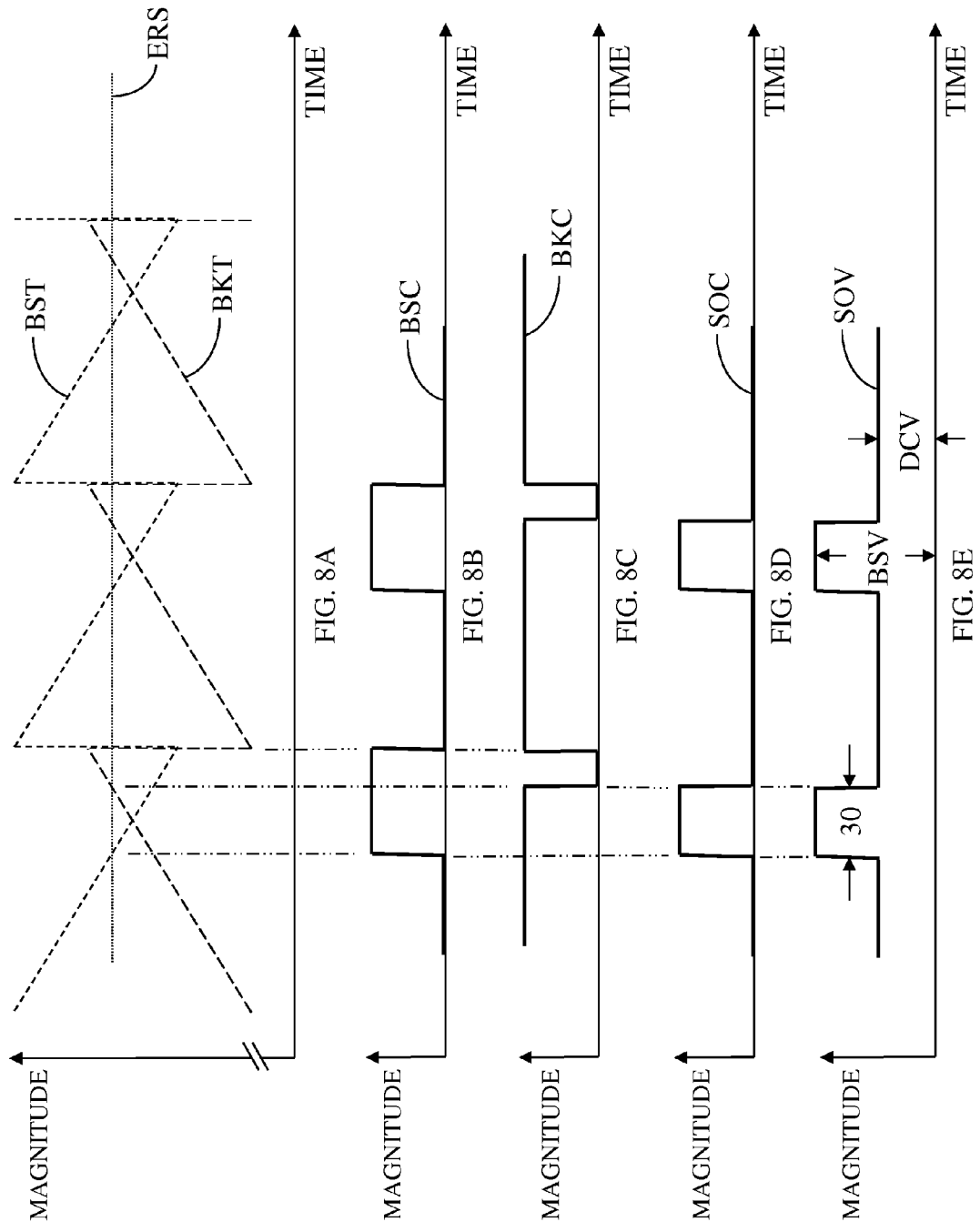

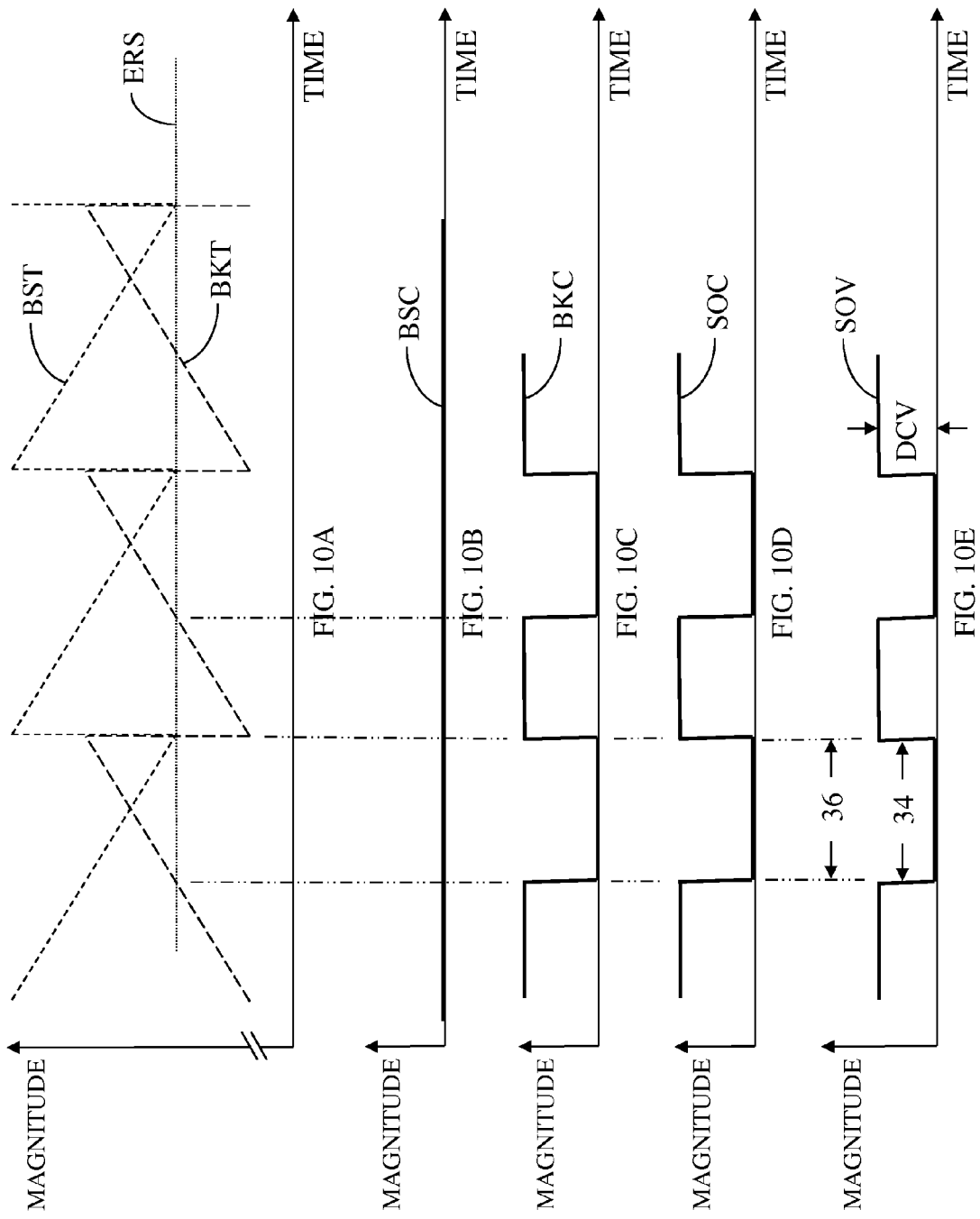

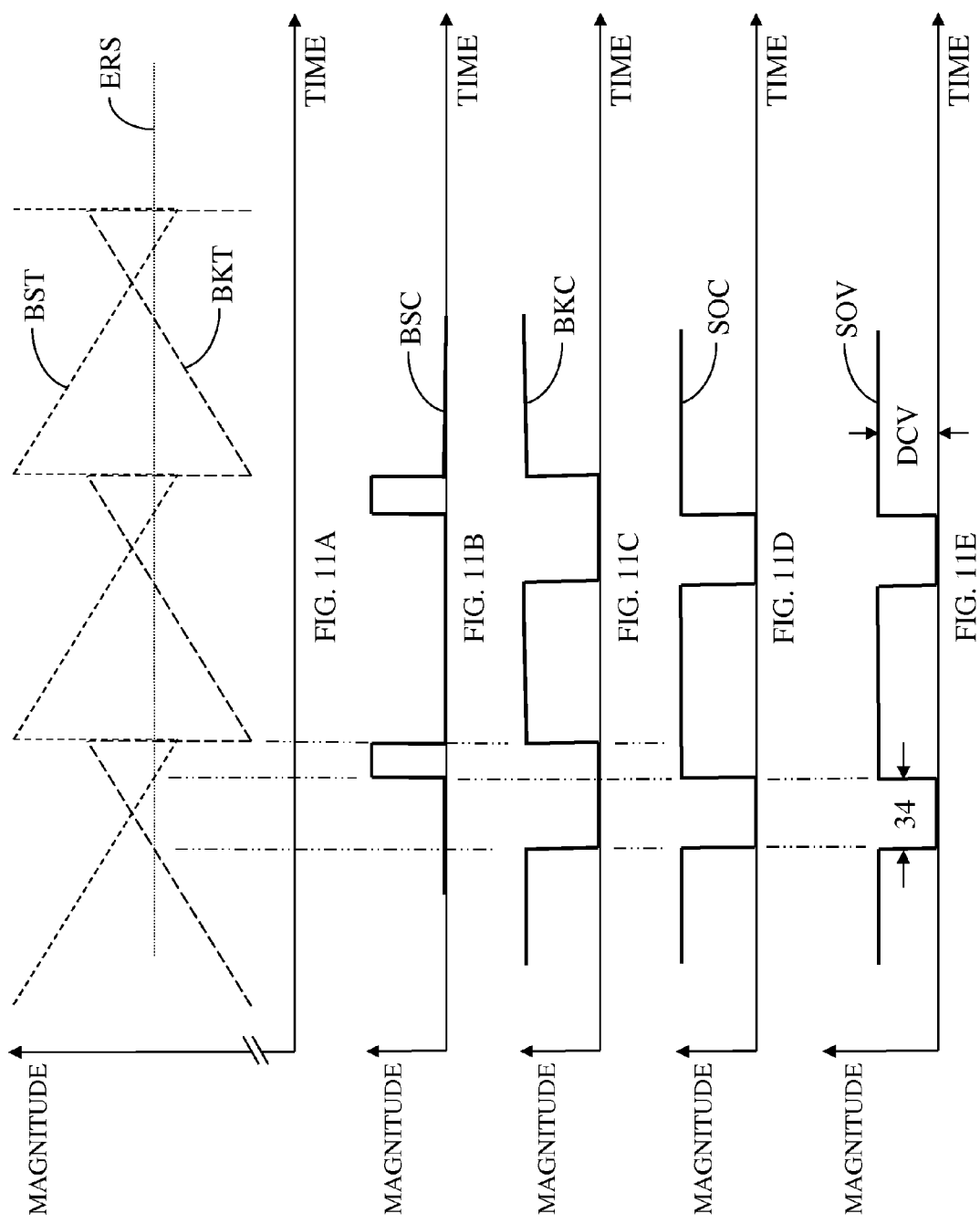

SMOOTH TRANSITIONING BUCK-BOOST DC-DC CONVERTER

RELATED APPLICATIONS

This application claims the benefit of U.S. provisional patent application No. 62/028,376, filed Jul. 24, 2014, the disclosure of which is incorporated herein by reference in its entirety.

FIELD OF THE DISCLOSURE

Embodiments of the present disclosure relate to DC-DC converters and radio frequency (RF) communications circuits, both of which may be used in RF communication systems.

BACKGROUND

Buck-boost DC-DC converters are traditionally used to provide a regulated power supply output signal, which has an output voltage, to a load using a DC source signal, which is provided by a DC power source, such as a battery. The DC source signal has a DC source voltage. The buck-boost DC-DC converter regulates the output voltage based on a setpoint, which is representative of a desired magnitude of the output voltage. The buck-boost DC-DC converter typically operates in either a boost mode or a buck mode to provide the power supply output signal based on the setpoint and the DC source voltage. When the desired magnitude of the output voltage is less than the DC source voltage, the buck-boost DC-DC converter operates in the buck mode. When the desired magnitude of the output voltage is greater than the DC source voltage, the buck-boost DC-DC converter operates in the boost mode.

One version of a traditional buck-boost DC-DC converter uses either the DC source signal or a power supply sourced signal to provide the regulated power supply output signal. The power supply sourced signal has a power supply sourced voltage, which is greater than the DC source voltage. Therefore, when the desired magnitude of the output voltage is less than the DC source voltage, the buck-boost DC-DC converter uses the DC source signal and operates in the buck mode. When the desired magnitude of the output voltage is greater than the DC source voltage, the buck-boost DC-DC converter uses the power supply sourced signal and operates in the boost mode. One particular challenge for traditional buck-boost DC-DC converters occurs when transitioning between the buck mode and the boost mode, which may occur due to changes in the DC source voltage, the setpoint, or both. Such transitioning may cause momentary variations, or glitches, in the regulated power supply output signal. Such momentary variations may cause unacceptable behavior in the load. As a result, there is a need for a buck-boost DC-DC converter that can provide smooth transitioning between a buck mode and a boost mode without causing glitches.

SUMMARY

A buck-boost DC-DC converter, which includes converter control circuitry, converter switching circuitry, and a first inductive element, is disclosed according to one embodiment of the present disclosure. The converter control circuitry provides a buck mode timing signal and a boost mode timing signal. The converter switching circuitry provides a switching output signal. During a buck mode of the buck-boost DC-DC converter, when a buck pulse-width of the switching output signal is less than a buck pulse-width threshold, the buck pulse-width is limited based on both the buck mode timing signal and the boost mode timing signal. During a boost mode of the buck-boost DC-DC converter, when a boost pulse-width of the switching output signal is less than a boost pulse-width threshold, the boost pulse-width is limited based on both the buck mode timing signal and the boost mode timing signal. The first inductive element receives and filters the switching output signal to provide a converter output signal.

When transitioning between the buck mode and the boost mode, by limiting the buck pulse-width and the boost pulse-width, momentary variations, or glitches, in the converter output signal may be reduced or eliminated.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 4A is a graph illustrating an output error signal, a buck mode timing signal, and a boost mode timing signal illustrated in FIG. 3 according to one embodiment of the output error signal, the buck mode timing signal, and the boost mode timing signal.

FIG. 4B is a graph illustrating the boost control signal illustrated in FIG. 3 according to one embodiment of the boost control signal.

FIG. 4C is a graph illustrating the buck control signal illustrated in FIG. 3 according to one embodiment of the buck control signal.

FIG. 4D is a graph illustrating the switching control signal illustrated in FIG. 3 according to one embodiment of the switching control signal.

FIG. 4E is a graph illustrating the switching output voltage illustrated in FIG. 1 according to one embodiment of the switching output voltage.

FIG. 5A is a graph illustrating the output error signal, the buck mode timing signal, and the boost mode timing signal illustrated in FIG. 3 according to an alternate embodiment of the output error signal, the buck mode timing signal, and the boost mode timing signal.

FIG. 5B is a graph illustrating the boost control signal illustrated in FIG. 3 according to an alternate embodiment of the boost control signal.

FIG. 5C is a graph illustrating the buck control signal illustrated in FIG. 3 according to an alternate embodiment of the buck control signal.

FIG. 5D is a graph illustrating the switching control signal illustrated in FIG. 3 according to an alternate embodiment of the switching control signal.

FIG. 5E is a graph illustrating the switching output voltage illustrated in FIG. 1 according to an alternate embodiment of the switching output voltage.

FIG. 6A is a graph illustrating the output error signal, the buck mode timing signal, and the boost mode timing signal illustrated in FIG. 3 according to an additional embodiment of the output error signal, the buck mode timing signal, and the boost mode timing signal.

FIG. 6B is a graph illustrating the boost control signal illustrated in FIG. 3 according to an additional embodiment of the boost control signal.

FIG. 6C is a graph illustrating the buck control signal illustrated in FIG. 3 according to an additional embodiment of the buck control signal.

FIG. 6D is a graph illustrating the switching control signal illustrated in FIG. 3 according to an additional embodiment of the switching control signal.

FIG. 6E is a graph illustrating the switching output voltage illustrated in FIG. 1 according to an additional embodiment of the switching output voltage.

FIG. 7A is a graph illustrating the output error signal, the buck mode timing signal, and the boost mode timing signal illustrated in FIG. 3 according to another embodiment of the output error signal, the buck mode timing signal, and the boost mode timing signal.

FIG. 7B is a graph illustrating the boost control signal illustrated in FIG. 3 according to another embodiment of the boost control signal.

FIG. 7C is a graph illustrating the buck control signal illustrated in FIG. 3 according to another embodiment of the buck control signal.

FIG. 7D is a graph illustrating the switching control signal illustrated in FIG. 3 according to another embodiment of the switching control signal.

FIG. 7E is a graph illustrating the switching output voltage illustrated in FIG. 1 according to another embodiment of the switching output voltage.

FIG. 8A is a graph illustrating an output error signal, a buck mode timing signal, and a boost mode timing signal illustrated in FIG. 3 according to one embodiment of the output error signal, the buck mode timing signal, and the boost mode timing signal.

FIG. 8B is a graph illustrating the boost control signal illustrated in FIG. 3 according to one embodiment of the boost control signal.

FIG. 8C is a graph illustrating the buck control signal illustrated in FIG. 3 according to one embodiment of the buck control signal.

FIG. 8D is a graph illustrating the switching control signal illustrated in FIG. 3 according to one embodiment of the switching control signal.

FIG. 8E is a graph illustrating the switching output voltage illustrated in FIG. 1 according to one embodiment of the switching output voltage.

FIG. 10A is a graph illustrating the output error signal, the buck mode timing signal, and the boost mode timing signal illustrated in FIG. 3 according to an additional embodiment of the output error signal, the buck mode timing signal, and the boost mode timing signal.

FIG. 10B is a graph illustrating the boost control signal illustrated in FIG. 3 according to an additional embodiment of the boost control signal.

FIG. 10C is a graph illustrating the buck control signal illustrated in FIG. 3 according to an additional embodiment of the buck control signal.

FIG. 10D is a graph illustrating the switching control signal illustrated in FIG. 3 according to an additional embodiment of the switching control signal.

FIG. 10E is a graph illustrating the switching output voltage illustrated in FIG. 1 according to an additional embodiment of the switching output voltage.

FIG. 11A is a graph illustrating the output error signal, the buck mode timing signal, and the boost mode timing signal illustrated in FIG. 3 according to another embodiment of the output error signal, the buck mode timing signal, and the boost mode timing signal.

FIG. 11B is a graph illustrating the boost control signal illustrated in FIG. 3 according to another embodiment of the boost control signal.

FIG. 11C is a graph illustrating the buck control signal illustrated in FIG. 3 according to another embodiment of the buck control signal.

FIG. 11D is a graph illustrating the switching control signal illustrated in FIG. 3 according to another embodiment of the switching control signal.

FIG. 11E is a graph illustrating the switching output voltage illustrated in FIG. 1 according to another embodiment of the switching output voltage.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A buck-boost DC-DC converter, which includes converter control circuitry, converter switching circuitry, and a first inductive element, is disclosed according to one embodiment of the present disclosure. The buck-boost DC-DC converter operates in both a buck mode and a boost mode. The converter control circuitry provides a buck mode timing signal and a boost mode timing signal. The converter switching circuitry provides a switching output signal. During a buck mode of the buck-boost DC-DC converter, when a buck pulse-width of the switching output signal is less than a buck pulse-width threshold, the buck pulse-width is limited based on both the buck mode timing signal and the boost mode timing signal. During a boost mode of the buck-boost DC-DC converter, when a boost pulse-width of the switching output signal is less than a boost pulse-width threshold, the boost pulse-width is limited based on both the buck mode timing signal and the boost mode timing signal. The first inductive element receives and filters the switching output signal to provide a converter output signal.

When transitioning between the buck mode and the boost mode, by limiting the buck pulse-width and the boost pulse-width, momentary variations, or glitches, in the converter output signal may be reduced or eliminated.

Figure 1:
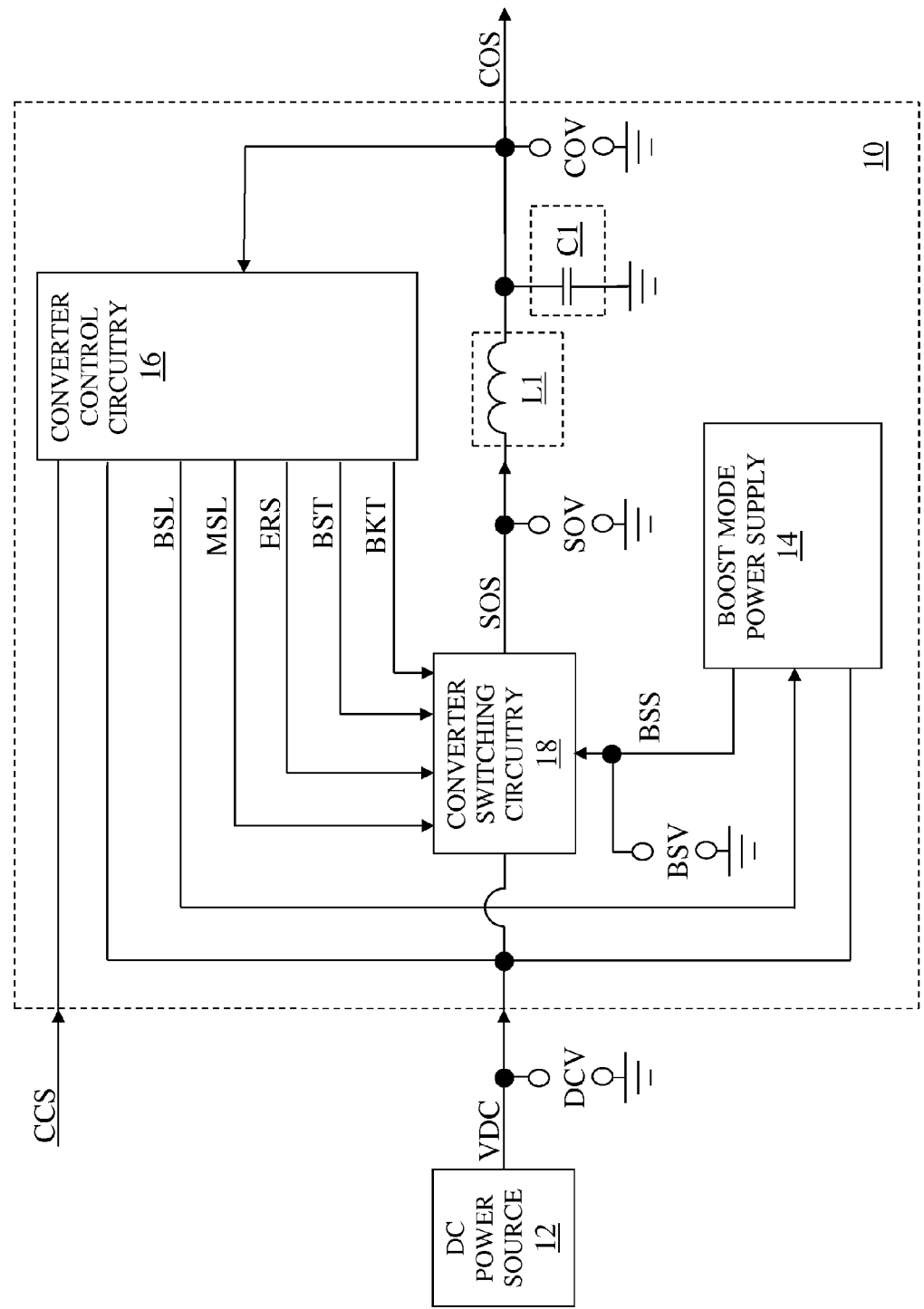
FIG. 1 shows a buck-boost DC-DC converter and a DC power source according to one embodiment of the buck-boost DC-DC converter and the DC power source.

FIG. 1 shows a buck-boost DC-DC converter 10 and a DC power source 12 according to one embodiment of the buck-boost DC-DC converter 10 and the DC power source 12. The buck-boost DC-DC converter 10 includes a boost mode power supply 14, converter control circuitry 16, converter switching circuitry 18, a first inductive element L1, and a first capacitive element C1. The first inductive element L1 and the first capacitive element C1 are coupled in series between the converter switching circuitry 18 and ground. The buck-boost DC-DC converter 10 operates in both a buck mode and a boost mode.

The converter control circuitry 16 receives a converter configuration signal CCS. In one embodiment of the buck-boost DC-DC converter 10, configuration of the buck-boost DC-DC converter 10 is based on the converter configuration signal CCS. The DC power source 12 provides a DC source signal VDC to the boost mode power supply 14, the converter control circuitry 16, and the converter switching circuitry 18. The DC source signal VDC has a DC source voltage DCV. In one embodiment of the DC power source 12, the DC power source 12 is a battery. In one embodiment of the DC power source 12, the DC source voltage DCV is between 2.5 volts and 5.5 volts. The boost mode power supply 14 provides a boost supply signal BSS to the converter switching circuitry 18. The boost supply signal BSS has a boost supply voltage BSV.

The converter control circuitry 16 provides a boost select signal BSL to the boost mode power supply 14. Additionally, the converter control circuitry 16 provides a mode select signal MSL, an output error signal ERS, a boost mode timing signal BST, and a buck mode timing signal BKT to the converter switching circuitry 18. In an alternate embodiment of the converter control circuitry 16, the boost select signal BSL is omitted.

The first inductive element L1 and the first capacitive element C1 are coupled in series to form a lowpass filter. The converter switching circuitry 18 provides a switching output signal SOS to the first inductive element L1, which receives and filters the switching output signal SOS to provide a converter output signal COS. The switching output signal SOS has a switching output voltage SOV and the converter output signal COS has a converter output voltage COV. The converter configuration signal CCS is representative of a setpoint of the converter output voltage COV. The setpoint of the converter output voltage COV is a desired magnitude of the converter output voltage COV.

In one embodiment of the converter control circuitry 16, the converter control circuitry 16 selects one of a buck mode and a boost mode based on the DC source voltage DCV as measured by the converter control circuitry 16 and the setpoint of the converter output voltage COV. The mode select signal MSL is representative of the mode selection made by the converter control circuitry 16. In one embodiment of the converter control circuitry 16, the converter control circuitry 16 selects the boost mode when the setpoint of the converter output voltage COV is greater than the DC source voltage DCV. As such, the converter control circuitry 16 selects the buck mode when the setpoint of the converter output voltage COV is less than the DC source voltage DCV. In one embodiment of the converter control circuitry 16, the converter control circuitry 16 selects the boost mode when the setpoint of the converter output voltage COV is equal to the DC source voltage DCV. In an alternate embodiment of the converter control circuitry 16, the converter control circuitry 16 selects the buck mode when the setpoint of the converter output voltage COV is equal to the DC source voltage DCV.

In one embodiment of the converter control circuitry 16, the converter control circuitry 16 receives the converter output signal COS. As such, in one embodiment of the converter control circuitry 16, the converter control circuitry 16 regulates the converter output voltage COV by selecting one of the buck mode and the boost mode, by making adjustments to the output error signal ERS based on a difference between the setpoint of the converter output voltage COV and the converter output voltage COV, by operating within constraints of the converter switching circuitry 18, by operating within constraints of the boost mode power supply 14, the like, or any combination thereof.

In one embodiment of the converter control circuitry 16, the converter configuration signal CCS provides additional information regarding the setpoint of the converter output voltage COV to the converter control circuitry 16. This additional information may include anticipated changes to the setpoint of the converter output voltage COV, such as direction of anticipated setpoint changes, magnitude of anticipated setpoint changes, speed of anticipated setpoint changes, the like, on any combination thereof. In this regard, the converter control circuitry 16 may change mode selection, may adjust the output error signal ERS, or both based on the additional information.

In one embodiment of the converter control circuitry 16, the converter control circuitry 16 provides the output error signal ERS, which is representative of a difference between the setpoint of the converter output voltage COV and the converter output voltage COV as measured by the converter control circuitry 16.

The boost mode power supply 14 is used to receive and boost the DC source signal VDC to provide the boost supply signal BSS. In a first embodiment of the boost mode power supply 14, the boost supply voltage BSV is nominally equal to 1.5 times the DC source voltage DCV. In a second embodiment of the boost mode power supply 14, the boost supply voltage BSV is nominally equal to 2 times the DC source voltage DCV. In a third embodiment of the boost mode power supply 14, the boost supply voltage BSV is a selected one of nominally equal to the DC source voltage DCV and nominally equal to 1.5 times the DC source voltage DCV based on the boost select signal BSL. In a fourth embodiment of the boost mode power supply 14, the boost supply voltage BSV is a selected one of nominally equal to the DC source voltage DCV and nominally equal to 2 times the DC source voltage DCV based on the boost select signal BSL. In a fifth embodiment of the boost mode power supply 14, the boost supply voltage BSV is a selected one of any combination of nominally equal to ground, nominally equal to the DC source voltage DCV, nominally equal to 1.5 times the DC source voltage DCV, and nominally equal to 2 times the DC source voltage DCV based on the boost select signal BSL.

In a first exemplary embodiment of the boost mode power supply 14, actual voltages of the boost supply voltage BSV are within five percent of nominal values. In a second exemplary embodiment of the boost mode power supply 14, actual voltages of the boost supply voltage BSV are within ten percent of nominal values. In a third exemplary embodiment of the boost mode power supply 14, actual voltages of the boost supply voltage BSV are within twenty-five percent of nominal values. In a fourth exemplary embodiment of the boost mode power supply 14, actual voltages of the boost supply voltage BSV are within fifty percent of nominal values.

In one embodiment of the converter control circuitry 16, the converter control circuitry 16 selects one of the boost mode and a buck mode based on the setpoint of the converter output voltage COV and the DC source voltage DCV. In an alternate embodiment of the converter control circuitry 16, the converter control circuitry 16 selects one of the boost mode and the buck mode based on the setpoint of the converter output voltage COV, the DC source voltage DCV, and the converter output voltage COV.

In a first embodiment of the converter switching circuitry 18, during the buck mode, the switching output signal SOS toggles between being based on ground and being based on the DC source signal VDC, such that the switching output voltage SOV toggles between nominally zero volts and nominally the DC source voltage DCV.

In a second embodiment of the converter switching circuitry 18, during the buck mode, the switching output signal SOS toggles between being based on the boost supply signal BSS and being based on the DC source signal VDC, such that the boost supply voltage BSV is nominally equal to zero volts. As such, the switching output voltage SOV toggles between nominally zero volts and nominally the DC source voltage DCV.

In a third embodiment of the converter switching circuitry 18, during the buck mode, the switching output signal SOS toggles between being based on the boost supply signal BSS and being based on ground, such that the boost supply voltage BSV is nominally equal to the DC source voltage DCV. As such, the switching output voltage SOV toggles between nominally zero volts and nominally the DC source voltage DCV.

In a fourth embodiment of the converter switching circuitry 18, during the buck mode, the switching output signal SOS is based on the boost supply signal BSS, such that the boost supply voltage BSV toggles between nominally equal to the DC source voltage DCV and nominally equal to zero volts.

In a fifth embodiment of the converter switching circuitry 18, during the boost mode, the switching output signal SOS toggles between being based on the boost supply signal BSS and being based on the DC source signal VDC, such that the boost supply voltage BSV is nominally equal to 1.5 times the DC source voltage DCV. As such, the switching output voltage SOV toggles between nominally the DC source voltage DCV and nominally 1.5 times the DC source voltage DCV.

In a sixth embodiment of the converter switching circuitry 18, during the boost mode, the switching output signal SOS toggles between being based on the boost supply signal BSS and being based on the DC source signal VDC, such that the boost supply voltage BSV is nominally equal to 2 times the DC source voltage DCV. As such, the switching output voltage SOV toggles between nominally the DC source voltage DCV and nominally 2 times the DC source voltage DCV.

In a seventh embodiment of the converter switching circuitry 18, during the boost mode, the switching output signal SOS is based on the boost supply signal BSS, such that the boost supply voltage BSV toggles between nominally equal to the DC source voltage DCV and nominally equal to 1.5 times the DC source voltage DCV.

In an eighth embodiment of the converter switching circuitry 18, during the boost mode, the switching output signal SOS is based on the boost supply signal BSS, such that the boost supply voltage BSV toggles between nominally equal to the DC source voltage DCV and nominally equal to 2 times the DC source voltage DCV.

Figure 2:
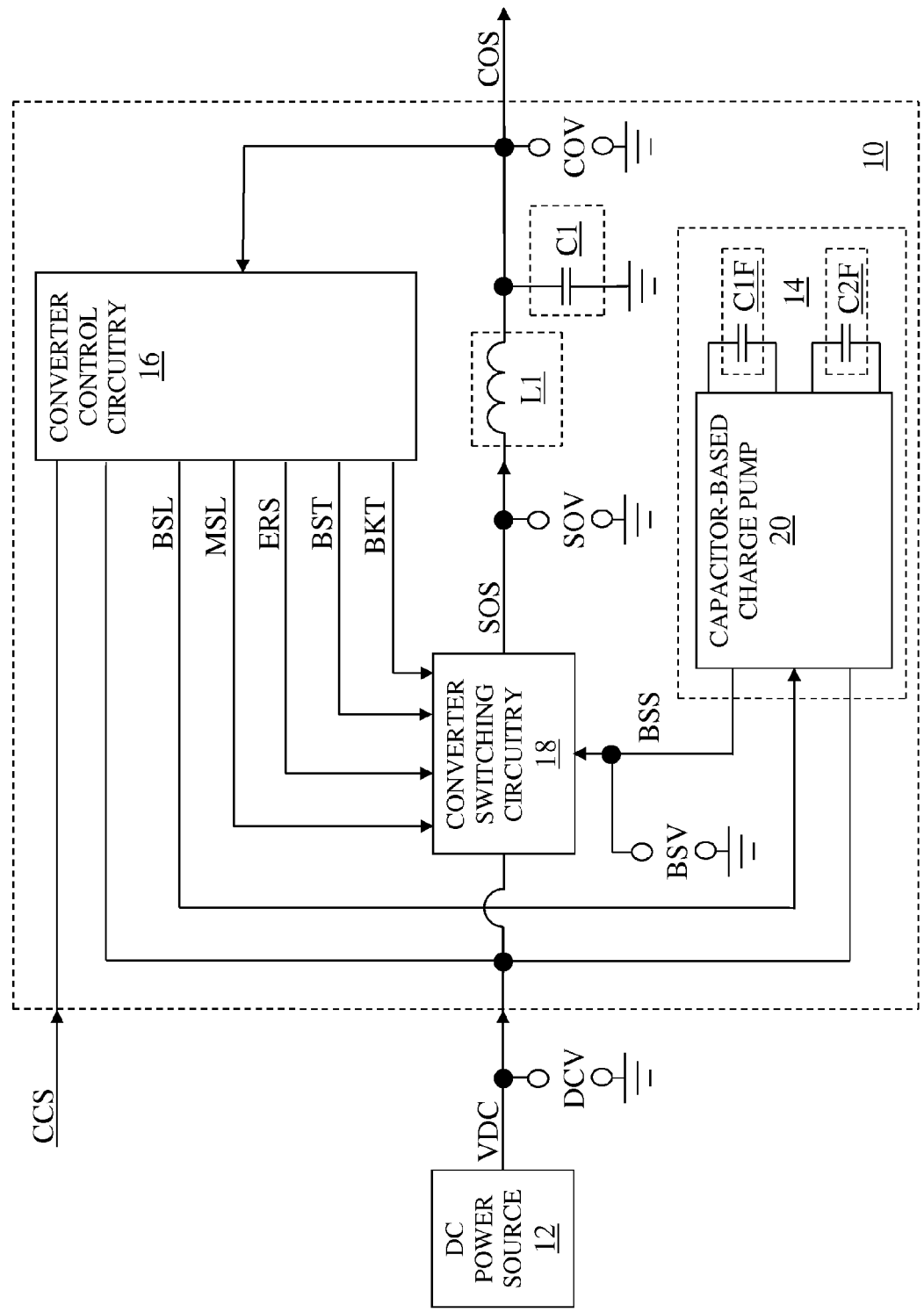
FIG. 2 shows the buck-boost DC-DC converter and the DC power source according to an alternate embodiment of the buck-boost DC-DC converter and the DC power source.

FIG. 2 shows the buck-boost DC-DC converter 10 and the DC power source 12 according to an alternate embodiment of the buck-boost DC-DC converter 10 and the DC power source 12. The buck-boost DC-DC converter 10 and the DC power source 12 illustrated in FIG. 2 are similar to the buck-boost DC-DC converter 10 and the DC power source 12 illustrated in FIG. 1, except the boost mode power supply 14 illustrated in FIG. 2 includes a capacitor-based charge pump 20, a first flying capacitive element C1F, and a second flying capacitive element C2F. The first flying capacitive element C1F and the second flying capacitive element C2F are coupled to the capacitor-based charge pump 20. In general, the first flying capacitive element C1F and the second flying capacitive element C2F provide a pair of flying capacitive elements, which are coupled to the capacitor-based charge pump 20. The capacitor-based charge pump 20 transfers charge from the DC power source 12 to the converter switching circuitry 18 using the pair of flying capacitive elements.

Figure 3:
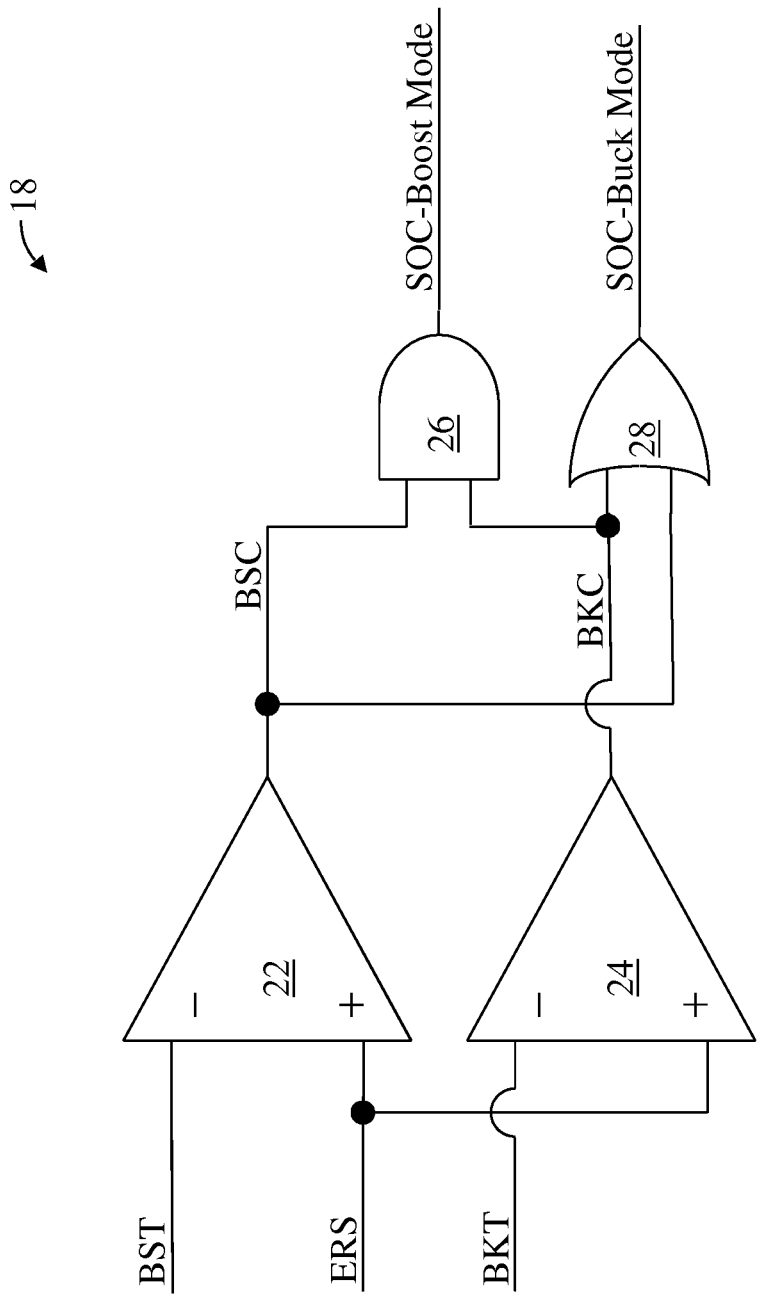
FIG. 3 shows details of a portion of converter switching circuitry illustrated in FIG. 1 according to one embodiment of the converter switching circuitry.

FIG. 3 shows details of a portion of the converter switching circuitry 18 illustrated in FIG. 1 according to one embodiment of the converter switching circuitry 18. The converter switching circuitry 18 includes a boost comparator 22, a buck comparator 24, an AND gate 26, and an OR gate 28. A non-inverting input to the boost comparator 22 and a non-inverting input to the buck comparator 24 receive an output error signal ERS. An inverting input to the boost comparator 22 receives the boost mode timing signal BST. An inverting input to the buck comparator 24 receives the buck mode timing signal BKT. The boost comparator 22 provides a boost control signal BSC to the AND gate 26 and the OR gate 28. The buck comparator 24 provides a buck control signal BKC to the AND gate 26 and the OR gate 28. The AND gate 26 provides a switching control signal SOC-Boost Mode. The OR gate 28 provides a switching control signal SOC-Buck Mode.

During the boost mode, a switching control signal SOC (FIG. 4D), (FIG. 5D), (FIG. 6D), (FIG. 7D), (FIG. 8D), (FIG. 9D), (FIG. 10D), (FIG. 11D) is based on the switching control signal SOC-Boost Mode. During the buck mode, the switching control signal SOC (FIG. 4D), (FIG. 5D), (FIG. 6D), (FIG. 7D), (FIG. 8D), (FIG. 9D), (FIG. 10D), (FIG. 11D) is based on the switching control signal SOC-Buck Mode. The switching output signal SOS (FIG. 1) is based on the switching control signal SOC (FIG. 4D), (FIG. 5D), (FIG. 6D), (FIG. 7D), (FIG. 8D), (FIG. 9D), (FIG. 10D), (FIG. 11D).

FIG. 4A is a graph illustrating the output error signal ERS, the buck mode timing signal BKT, and the boost mode timing signal BST illustrated in FIG. 3 according to one embodiment of the output error signal ERS, the buck mode timing signal BKT, and the boost mode timing signal BST. Since the output error signal ERS is representative of a difference between the setpoint of the converter output voltage COV (FIG. 1) and the converter output voltage COV (FIG. 1) as measured by the converter control circuitry 16 (FIG. 1), the output error signal ERS is used in conjunction with the buck mode timing signal BKT and the boost mode timing signal BST to control the buck-boost DC-DC converter 10 (FIG. 1).

The output error signal ERS illustrated in FIG. 4A is representative of a condition in which the setpoint of the converter output voltage COV (FIG. 1) is equal to the converter output voltage COV (FIG. 1). As such, the buck-boost DC-DC converter 10 (FIG. 1) is operating in the boost mode. The buck mode timing signal BKT and the boost mode timing signal BST are both triangular signals. Since the setpoint of the converter output voltage COV (FIG. 1) is equal to the converter output voltage COV (FIG. 1), there is no error between the setpoint of the converter output voltage COV (FIG. 1) and the converter output voltage COV (FIG. 1). Therefore, the output error signal ERS is midway between peaks of the boost mode timing signal BST and valleys of the buck mode timing signal BKT.

FIG. 4B is a graph illustrating the boost control signal BSC illustrated in FIG. 3 according to one embodiment of the boost control signal BSC. When a magnitude of the boost mode timing signal BST is greater than a magnitude of the output error signal ERS, the boost control signal BSC is a logic LOW. When the magnitude of the boost mode timing signal BST is less than the magnitude of the output error signal ERS, the boost control signal BSC is a logic HIGH.

FIG. 4C is a graph illustrating the buck control signal BKC illustrated in FIG. 3 according to one embodiment of the buck control signal BKC. When a magnitude of the buck mode timing signal BKT is greater than a magnitude of the output error signal ERS, the buck control signal BKC is a logic LOW. When the magnitude of the buck mode timing signal BKT is less than the magnitude of the output error signal ERS, the buck control signal BKC is a logic HIGH.

FIG. 4D is a graph illustrating the switching control signal SOC illustrated in FIG. 3 according to one embodiment of the switching control signal SOC. Since the buck-boost DC-DC converter 10 (FIG. 1) is operating in the boost mode, the switching control signal SOC is based on the SOC-Boost Mode. Therefore, the switching control signal SOC is based on ANDing the boost control signal BSC and the buck control signal BKC together. As such, the switching control signal SOC is a constant logic LOW.

FIG. 4E is a graph illustrating the switching output voltage SOV illustrated in FIG. 1 according to one embodiment of the switching output voltage SOV. Since the switching output voltage SOV is based on the switching control signal SOC, and since the buck-boost DC-DC converter 10 (FIG. 1) is operating in the boost mode, the switching output voltage SOV has a constant magnitude, which is equal to the DC source voltage DCV.

FIG. 5A is a graph illustrating the output error signal ERS, the buck mode timing signal BKT, and the boost mode timing signal BST illustrated in FIG. 3 according to an alternate embodiment of the output error signal ERS, the buck mode timing signal BKT, and the boost mode timing signal BST. The output error signal ERS, the buck mode timing signal BKT, and the boost mode timing signal BST illustrated in FIG. 5A are similar to the output error signal ERS, the buck mode timing signal BKT, and the boost mode timing signal BST illustrated in FIG. 4A, except the buck mode timing signal BKT and the boost mode timing signal BST illustrated in FIG. 5A are sawtooth signals instead of triangular signals.

FIG. 5B is a graph illustrating the boost control signal BSC illustrated in FIG. 3 according to an alternate embodiment of the boost control signal BSC. The boost control signal BSC illustrated in FIG. 5B is similar to the boost control signal BSC illustrated in FIG. 4B.

FIG. 5C is a graph illustrating the buck control signal BKC illustrated in FIG. 3 according to an alternate embodiment of the buck control signal BKC. The buck control signal BKC illustrated in FIG. 5C is similar to the buck control signal BKC illustrated in FIG. 4C.

FIG. 5D is a graph illustrating the switching control signal SOC illustrated in FIG. 3 according to an alternate embodiment of the switching control signal SOC. The switching control signal SOC illustrated in FIG. 5D is similar to the switching control signal SOC illustrated in FIG. 4D.

FIG. 5E is a graph illustrating the switching output voltage SOV illustrated in FIG. 1 according to an alternate embodiment of the switching output voltage SOV. The switching output voltage SOV illustrated in FIG. 5E is similar to the switching output voltage SOV illustrated in FIG. 4E.

FIG. 6A is a graph illustrating the output error signal ERS, the buck mode timing signal BKT, and the boost mode timing signal BST illustrated in FIG. 3 according to an additional embodiment of the output error signal ERS, the buck mode timing signal BKT, and the boost mode timing signal BST.

The buck mode timing signal BKT and the boost mode timing signal BST illustrated in FIG. 6A are similar to the buck mode timing signal BKT and the boost mode timing signal BST illustrated in FIG. 5A. The output error signal ERS illustrated in FIG. 6A is representative of a condition in which the setpoint of the converter output voltage COV (FIG. 1) is greater than the converter output voltage COV (FIG. 1). As such, the buck-boost DC-DC converter 10 (FIG. 1) is operating in the boost mode.

FIG. 6B is a graph illustrating the boost control signal BSC illustrated in FIG. 3 according to an additional embodiment of the boost control signal BSC. When a magnitude of the boost mode timing signal BST is greater than a magnitude of the output error signal ERS, the boost control signal BSC is a logic LOW. When the magnitude of the boost mode timing signal BST is less than the magnitude of the output error signal ERS, the boost control signal BSC is a logic HIGH.

FIG. 6C is a graph illustrating the buck control signal BKC illustrated in FIG. 3 according to an additional embodiment of the buck control signal BKC. When a magnitude of the buck mode timing signal BKT is greater than a magnitude of the output error signal ERS, the buck control signal BKC is a logic LOW. When the magnitude of the buck mode timing signal BKT is less than the magnitude of the output error signal ERS, the buck control signal BKC is a logic HIGH. Since the magnitude of the buck mode timing signal BKT is continuously less than the magnitude of the output error signal ERS, the buck control signal BKC is continuously a logic HIGH.

FIG. 6D is a graph illustrating the switching control signal SOC illustrated in FIG. 3 according to an additional embodiment of the switching control signal SOC. Since the buck-boost DC-DC converter 10 (FIG. 1) is operating in the boost mode, the switching control signal SOC is based on the SOC-Boost Mode. Therefore, the switching control signal SOC is based on ANDing the boost control signal BSC and the buck control signal BKC together. As such, the switching control signal SOC follows the boost control signal BSC.

FIG. 6E is a graph illustrating the switching output voltage SOV illustrated in FIG. 1 according to an additional embodiment of the switching output voltage SOV. Since the switching output voltage SOV is based on the switching control signal SOC, and since the buck-boost DC-DC converter 10 (FIG. 1) is operating in the boost mode, the switching output voltage SOV toggles between the DC source voltage DCV and the boost supply voltage BSV. As such, the switching output voltage SOV and the switching output signal SOS (FIG. 1) have a boost pulse-width 30.

FIG. 7A is a graph illustrating the output error signal ERS, the buck mode timing signal BKT, and the boost mode timing signal BST illustrated in FIG. 3 according to another embodiment of the output error signal ERS, the buck mode timing signal BKT, and the boost mode timing signal BST.

The buck mode timing signal BKT and the boost mode timing signal BST illustrated in FIG. 7A are similar to the buck mode timing signal BKT and the boost mode timing signal BST illustrated in FIG. 5A. The output error signal ERS illustrated in FIG. 7A is similar to the output error signal ERS illustrated in FIG. 6A, except the output error signal ERS illustrated in FIG. 7A is at the peaks of the buck mode timing signal BKT.

FIG. 7B is a graph illustrating the boost control signal BSC illustrated in FIG. 3 according to another embodiment of the boost control signal BSC. When the magnitude of the boost mode timing signal BST is greater than the magnitude of the output error signal ERS, the boost control signal BSC is a logic LOW. When the magnitude of the boost mode timing signal BST is less than the magnitude of the output error signal ERS, the boost control signal BSC is a logic HIGH.

FIG. 7C is a graph illustrating the buck control signal BKC illustrated in FIG. 3 according to another embodiment of the buck control signal BKC. When the magnitude of the buck mode timing signal BKT is greater than the magnitude of the output error signal ERS, the buck control signal BKC is a logic LOW. When the magnitude of the buck mode timing signal BKT is less than the magnitude of the output error signal ERS, the buck control signal BKC is a logic HIGH. Since the magnitude of the buck mode timing signal BKT is continuously less than the magnitude of the output error signal ERS, the buck control signal BKC is continuously a logic HIGH.

FIG. 7D is a graph illustrating the switching control signal SOC illustrated in FIG. 3 according to another embodiment of the switching control signal SOC. Since the buck-boost DC-DC converter 10 (FIG. 1) is operating in the boost mode, the switching control signal SOC is based on the SOC-Boost Mode. Therefore, the switching control signal SOC is based on ANDing the boost control signal BSC and the buck control signal BKC together. As such, the switching control signal SOC follows the boost control signal BSC.

FIG. 7E is a graph illustrating the switching output voltage SOV illustrated in FIG. 1 according to another embodiment of the switching output voltage SOV. Since the switching output voltage SOV is based on the switching control signal SOC, and since the buck-boost DC-DC converter 10 (FIG. 1) is operating in the boost mode, the switching output voltage SOV toggles between the DC source voltage DCV and the boost supply voltage BSV. As such, the switching output voltage SOV and the switching output signal SOS (FIG. 1) have the boost pulse-width 30. Since the output error signal ERS illustrated in FIG. 7A is at the peaks of the buck mode timing signal BKT, the boost pulse-width 30 is equal to a boost pulse-width threshold 32.

Therefore, during the boost mode, when the boost pulse-width 30 of the switching output signal SOS (FIG. 1) is less than the boost pulse-width threshold 32, the boost pulse-width 30 is limited based on both the buck mode timing signal BKT and the boost mode timing signal BST. During the boost mode, when the boost pulse-width 30 of the switching output signal SOS (FIG. 1) is greater than the boost pulse-width threshold 32, the boost pulse-width 30 is not limited based on the buck mode timing signal BKT.

FIG. 8A is a graph illustrating the output error signal ERS, the buck mode timing signal BKT, and the boost mode timing signal BST illustrated in FIG. 3 according to one embodiment of the output error signal ERS, the buck mode timing signal BKT, and the boost mode timing signal BST.

The buck mode timing signal BKT and the boost mode timing signal BST illustrated in FIG. 8A are similar to the buck mode timing signal BKT and the boost mode timing signal BST illustrated in FIG. 5A. The output error signal ERS illustrated in FIG. 8A is similar to the output error signal ERS illustrated in FIG. 6A, except the output error signal ERS illustrated in FIG. 8A is below the peaks of the buck mode timing signal BKT.

FIG. 8B is a graph illustrating the boost control signal BSC illustrated in FIG. 3 according to one embodiment of the boost control signal BSC. When the magnitude of the boost mode timing signal BST is greater than the magnitude of the output error signal ERS, the boost control signal BSC is a logic LOW. When the magnitude of the boost mode timing signal BST is less than the magnitude of the output error signal ERS, the boost control signal BSC is a logic HIGH.

FIG. 8C is a graph illustrating the buck control signal BKC illustrated in FIG. 3 according to another embodiment of the buck control signal BKC. When the magnitude of the buck mode timing signal BKT is greater than the magnitude of the output error signal ERS, the buck control signal BKC is a logic LOW. When the magnitude of the buck mode timing signal BKT is less than the magnitude of the output error signal ERS, the buck control signal BKC is a logic HIGH.

FIG. 8D is a graph illustrating the switching control signal SOC illustrated in FIG. 3 according to one embodiment of the switching control signal SOC. FIG. 8E is a graph illustrating the switching output voltage SOV illustrated in FIG. 1 according to one embodiment of the switching output voltage SOV.

Since the switching control signal SOC and the switching output voltage SOV are based on ANDing the boost control signal BSC and the buck control signal BKC together, the boost pulse-width 30 is limited based on the boost control signal BSC and the buck control signal BKC.

Figure 9A:
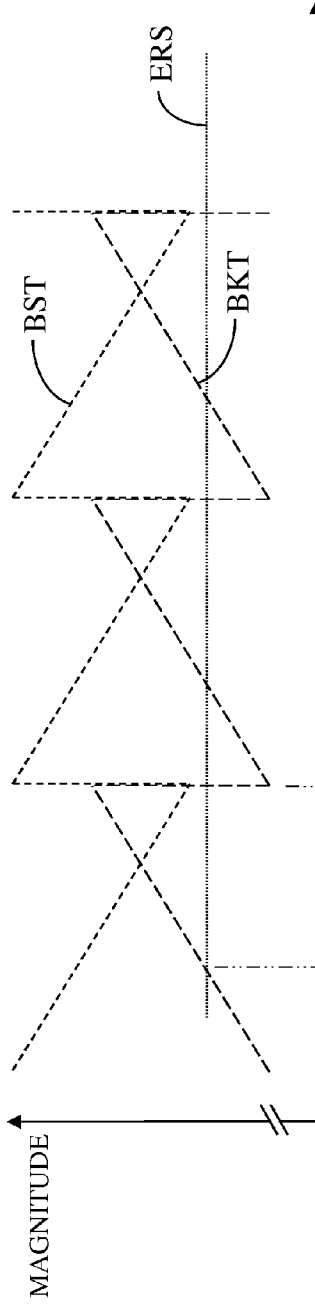
FIG. 9A is a graph illustrating the output error signal, the buck mode timing signal, and the boost mode timing signal illustrated in FIG. 3 according to an alternate embodiment of the output error signal, the buck mode timing signal, and the boost mode timing signal.

FIG. 9A is a graph illustrating the output error signal ERS, the buck mode timing signal BKT, and the boost mode timing signal BST illustrated in FIG. 3 according to an alternate embodiment of the output error signal ERS, the buck mode timing signal BKT, and the boost mode timing signal BST.

The buck mode timing signal BKT and the boost mode timing signal BST illustrated in FIG. 9A are similar to the buck mode timing signal BKT and the boost mode timing signal BST illustrated in FIG. 5A. The output error signal ERS illustrated in FIG. 9A is representative of a condition in which the setpoint of the converter output voltage COV (FIG. 1) is less than the converter output voltage COV (FIG. 1). As such, the buck-boost DC-DC converter 10 (FIG. 1) is operating in the buck mode.

Figure 9B:
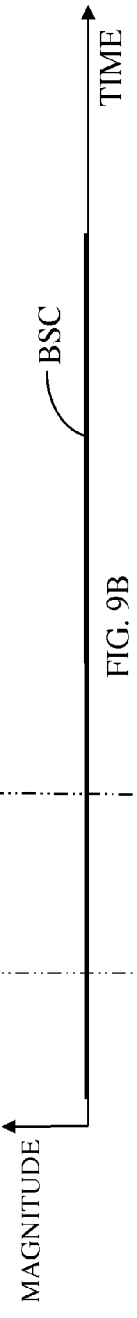
FIG. 9B is a graph illustrating the boost control signal illustrated in FIG. 3 according to an alternate embodiment of the boost control signal.

FIG. 9B is a graph illustrating the boost control signal BSC illustrated in FIG. 3 according to an alternate embodiment of the boost control signal BSC. When the magnitude of the boost mode timing signal BST is greater than the magnitude of the output error signal ERS, the boost control signal BSC is a logic LOW. When the magnitude of the boost mode timing signal BST is less than the magnitude of the output error signal ERS, the boost control signal BSC is a logic HIGH. Since the magnitude of the boost mode timing signal BST is continuously greater than the magnitude of the output error signal ERS, the boost control signal BSC is continuously a logic LOW.

Figure 9C:
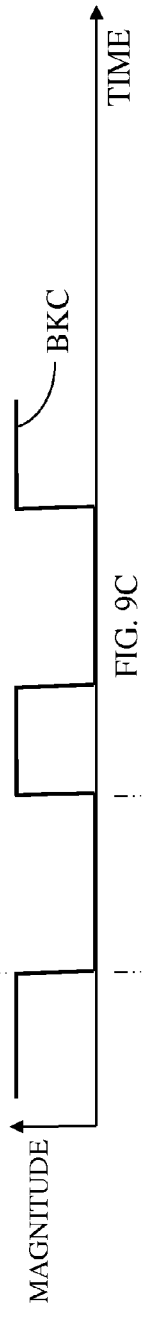
FIG. 9C is a graph illustrating the buck control signal illustrated in FIG. 3 according to an alternate embodiment of the buck control signal.

FIG. 9C is a graph illustrating the buck control signal BKC illustrated in FIG. 3 according to an alternate embodiment of the buck control signal BKC. When the magnitude of the buck mode timing signal BKT is greater than the magnitude of the output error signal ERS, the buck control signal BKC is a logic LOW. When the magnitude of the buck mode timing signal BKT is less than the magnitude of the output error signal ERS, the buck control signal BKC is a logic HIGH.

Figure 9D:
FIG. 9D is a graph illustrating the switching control signal illustrated in FIG. 3 according to an alternate embodiment of the switching control signal.

FIG. 9D is a graph illustrating the switching control signal SOC illustrated in FIG. 3 according to an alternate embodiment of the switching control signal SOC. Since the buck-boost DC-DC converter 10 (FIG. 1) is operating in the buck mode, the switching control signal SOC is based on the SOC-Buck Mode. Therefore, the switching control signal SOC is based on ORing the boost control signal BSC and the buck control signal BKC together. As such, the switching control signal SOC follows the buck control signal BKC.

Figure 9E:
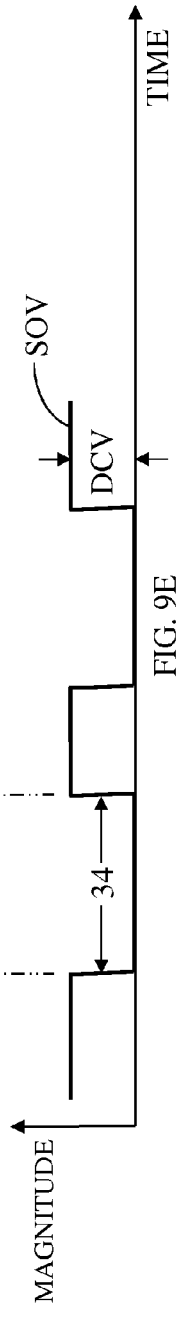
FIG. 9E is a graph illustrating the switching output voltage illustrated in FIG. 1 according to an alternate embodiment of the switching output voltage.

FIG. 9E is a graph illustrating the switching output voltage SOV illustrated in FIG. 1 according to an alternate embodiment of the switching output voltage SOV. Since the switching output voltage SOV is based on the switching control signal SOC, and since the buck-boost DC-DC converter 10 (FIG. 1) is operating in the buck mode, the switching output voltage SOV toggles between the DC source voltage DCV and ground. As such, the switching output voltage SOV and the switching output signal SOS (FIG. 1) have a buck pulse-width 34.

FIG. 10A is a graph illustrating the output error signal ERS, the buck mode timing signal BKT, and the boost mode timing signal BST illustrated in FIG. 3 according to an additional embodiment of the output error signal ERS, the buck mode timing signal BKT, and the boost mode timing signal BST.

The buck mode timing signal BKT and the boost mode timing signal BST illustrated in FIG. 10A are similar to the buck mode timing signal BKT and the boost mode timing signal BST illustrated in FIG. 5A. The output error signal ERS illustrated in FIG. 10A is similar to the output error signal ERS illustrated in FIG. 9A, except the output error signal ERS illustrated in FIG. 10A is at the valleys of the boost mode timing signal BST.

FIG. 10B is a graph illustrating the boost control signal BSC illustrated in FIG. 3 according to an additional embodiment of the boost control signal BSC. When the magnitude of the boost mode timing signal BST is greater than the magnitude of the output error signal ERS, the boost control signal BSC is a logic LOW. When the magnitude of the boost mode timing signal BST is less than the magnitude of the output error signal ERS, the boost control signal BSC is a logic HIGH. Since the magnitude of the boost mode timing signal BST is continuously greater than the magnitude of the output error signal ERS, the boost control signal BSC is continuously a logic LOW.

FIG. 10C is a graph illustrating the buck control signal BKC illustrated in FIG. 3 according to an additional embodiment of the buck control signal BKC. When the magnitude of the buck mode timing signal BKT is greater than the magnitude of the output error signal ERS, the buck control signal BKC is a logic LOW. When the magnitude of the buck mode timing signal BKT is less than the magnitude of the output error signal ERS, the buck control signal BKC is a logic HIGH.

FIG. 10D is a graph illustrating the switching control signal SOC illustrated in FIG. 3 according to an additional embodiment of the switching control signal SOC. Since the buck-boost DC-DC converter 10 (FIG. 1) is operating in the buck mode, the switching control signal SOC is based on the SOC-Buck Mode. Therefore, the switching control signal SOC is based on ORing the boost control signal BSC and the buck control signal BKC together. As such, the switching control signal SOC follows the buck control signal BKC.

FIG. 10E is a graph illustrating the switching output voltage SOV illustrated in FIG. 1 according to an additional embodiment of the switching output voltage SOV. Since the switching output voltage SOV is based on the switching control signal SOC, and since the buck-boost DC-DC converter 10 (FIG. 1) is operating in the buck mode, the switching output voltage SOV toggles between the DC source voltage DCV and ground. As such, the switching output voltage SOV and the switching output signal SOS (FIG. 1) have the buck pulse-width 34. Since the output error signal ERS illustrated in FIG. 10A is at the valleys of the buck mode timing signal BKT, the buck pulse-width 34 is equal to a buck pulse-width threshold 36.

Therefore, during the buck mode, when the buck pulse-width 34 of the switching output signal SOS (FIG. 1) is less than the buck pulse-width threshold 36, the buck pulse-width 34 is limited based on both the buck mode timing signal BKT and the boost mode timing signal BST. During the buck mode, when the buck pulse-width 34 of the switching output signal SOS (FIG. 1) is greater than the buck pulse-width threshold 36, the buck pulse-width 34 is not limited based on the boost mode timing signal BST.

FIG. 11A is a graph illustrating the output error signal ERS, the buck mode timing signal BKT, and the boost mode timing signal BST illustrated in FIG. 3 according to another embodiment of the output error signal ERS, the buck mode timing signal BKT, and the boost mode timing signal BST.

The buck mode timing signal BKT and the boost mode timing signal BST illustrated in FIG. 11A are similar to the buck mode timing signal BKT and the boost mode timing signal BST illustrated in FIG. 5A. The output error signal ERS illustrated in FIG. 11 A is similar to the output error signal ERS illustrated in FIG. 9A, except the output error signal ERS illustrated in FIG. 11A is above the valleys of the boost mode timing signal BST.

FIG. 11B is a graph illustrating the boost control signal BSC illustrated in FIG. 3 according to another embodiment of the boost control signal BSC. When the magnitude of the boost mode timing signal BST is greater than the magnitude of the output error signal ERS, the boost control signal BSC is a logic LOW. When the magnitude of the boost mode timing signal BST is less than the magnitude of the output error signal ERS, the boost control signal BSC is a logic HIGH.

FIG. 11C is a graph illustrating the buck control signal BKC illustrated in FIG. 3 according to another embodiment of the buck control signal BKC. When the magnitude of the buck mode timing signal BKT is greater than the magnitude of the output error signal ERS, the buck control signal BKC is a logic LOW. When the magnitude of the buck mode timing signal BKT is less than the magnitude of the output error signal ERS, the buck control signal BKC is a logic HIGH.

FIG. 11D is a graph illustrating the switching control signal SOC illustrated in FIG. 3 according to another embodiment of the switching control signal SOC. FIG. 11E is a graph illustrating the switching output voltage SOV illustrated in FIG. 1 according to another embodiment of the switching output voltage SOV.

Since the switching control signal SOC and the switching output voltage SOV are based on ORing the boost control signal BSC and the buck control signal BKC together, the buck pulse-width 34 is limited based on the boost control signal BSC and the buck control signal BKC.

Figure 12:
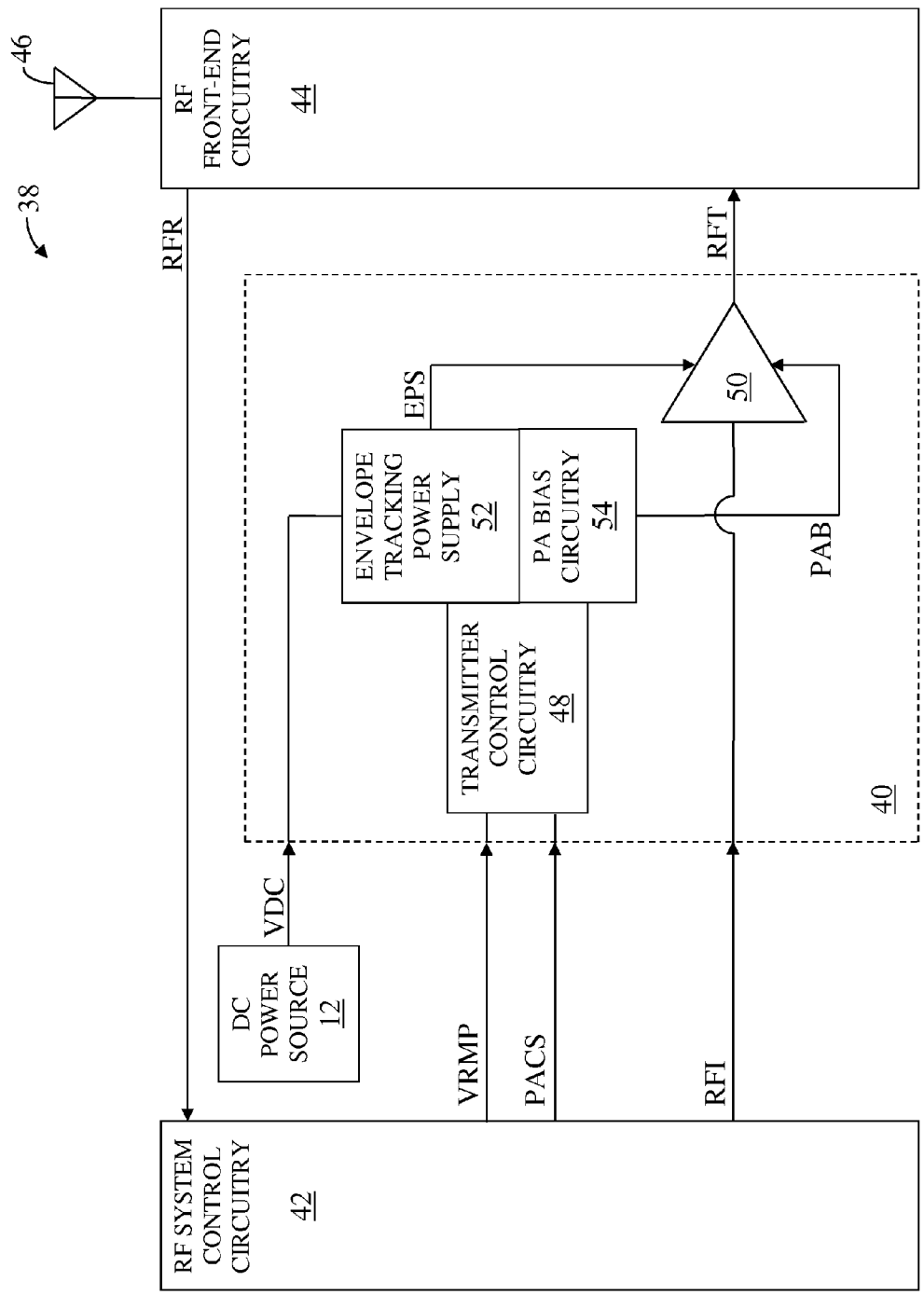
FIG. 12 shows an RF communications system according to one embodiment of the RF communications system.

FIG. 12 shows an RF communications system 38 according to one embodiment of the RF communications system 38. The RF communications system 38 includes RF transmitter circuitry 40, RF system control circuitry 42, RF front-end circuitry 44, an RF antenna 46, and the DC power source 12. The RF transmitter circuitry 40 includes transmitter control circuitry 48, an RF PA 50, an envelope tracking power supply 52, and PA bias circuitry 54.

In one embodiment of the RF communications system 38, the RF front-end circuitry 44 receives via the RF antenna 46, processes, and forwards an RF receive signal RFR to the RF system control circuitry 42. The RF system control circuitry 42 provides an envelope power supply control signal VRMP and a transmitter configuration signal PACS to the transmitter control circuitry 48. The RF system control circuitry 42 provides an RF input signal RFI to the RF PA 50. The DC power source 12 provides the DC source signal VDC to the envelope tracking power supply 52. In one embodiment of the DC power source 12, the DC power source 12 is a battery.

The transmitter control circuitry 48 is coupled to the envelope tracking power supply 52 and to the PA bias circuitry 54. The envelope tracking power supply 52 provides an envelope power supply signal EPS to the RF PA 50 based on the envelope power supply control signal VRMP. The DC source signal VDC provides power to the envelope tracking power supply 52. As such, the envelope power supply signal EPS is based on the DC source signal VDC. The envelope power supply control signal VRMP is representative of a setpoint of the envelope power supply signal EPS. The RF PA 50 receives and amplifies the RF input signal RFI to provide an RF transmit signal RFT using the envelope power supply signal EPS. The envelope power supply signal EPS provides power for amplification. The RF front-end circuitry 44 receives, processes, and transmits the RF transmit signal RFT via the RF antenna 46. In one embodiment of the RF transmitter circuitry 40, the transmitter control circuitry 48 configures the RF transmitter circuitry 40 based on the transmitter configuration signal PACS.

The PA bias circuitry 54 provides a PA bias signal PAB to the RF PA 50. In this regard, the PA bias circuitry 54 biases the RF PA 50 via the PA bias signal PAB. In one embodiment of the PA bias circuitry 54, the PA bias circuitry 54 biases the RF PA 50 based on the transmitter configuration signal PACS. In one embodiment of the RF front-end circuitry 44, the RF front-end circuitry 44 includes at least one RF switch, at least one RF amplifier, at least one RF filter, at least one RF duplexer, at least one RF diplexer, at least one RF amplifier, the like, or any combination thereof. In one embodiment of the RF system control circuitry 42, the RF system control circuitry 42 is RF transceiver circuitry, which may include an RF transceiver IC, baseband controller circuitry, the like, or any combination thereof.

Figure 13:
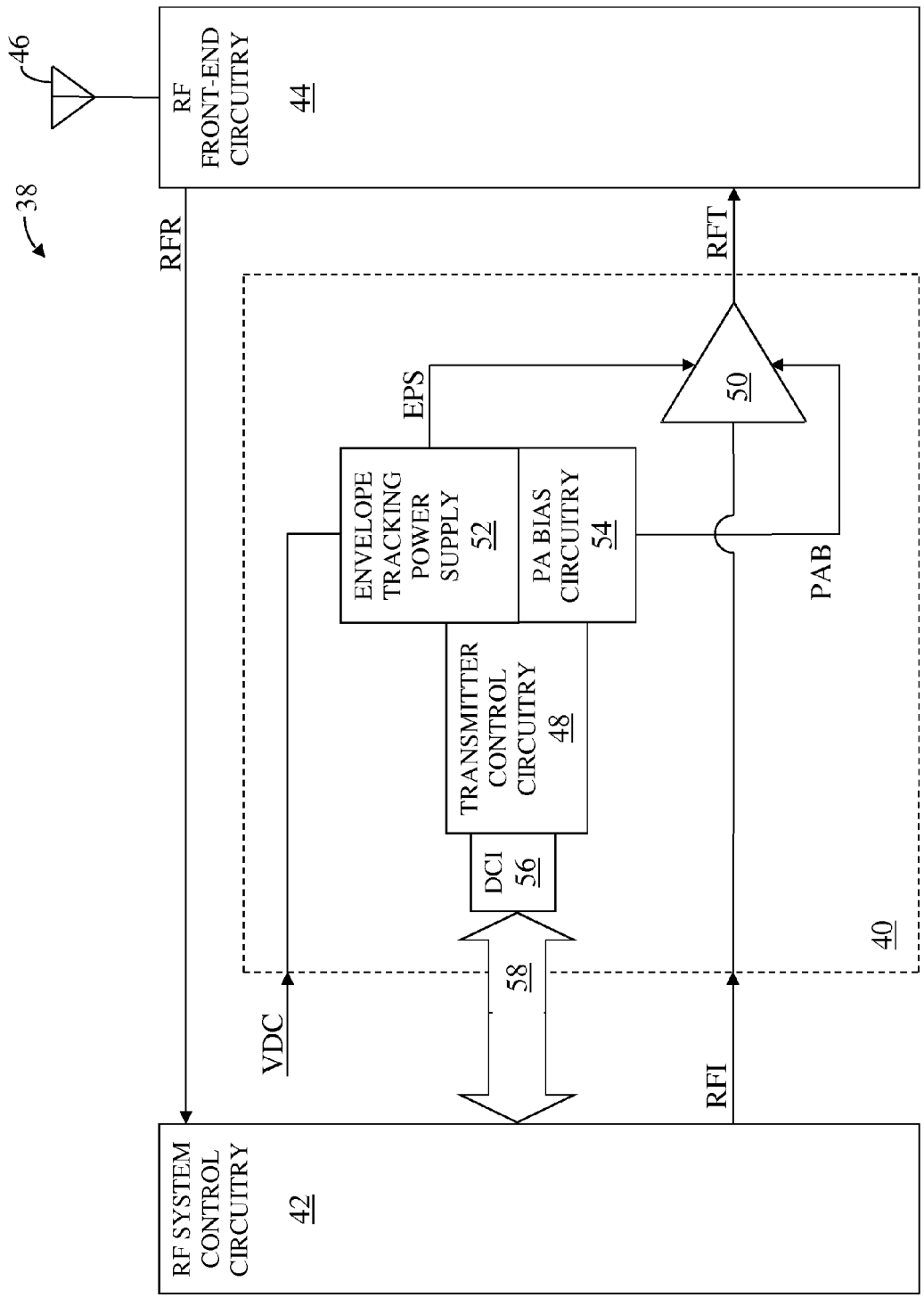
FIG. 13 shows the RF communications system according to an alternate embodiment of the RF communications system.

FIG. 13 shows the RF communications system 38 according to an alternate embodiment of the RF communications system 38. The RF communications system 38 illustrated in FIG. 13 is similar to the RF communications system 38 illustrated in FIG. 12, except in the RF communications system 38 illustrated in FIG. 13, the RF transmitter circuitry 40 further includes a digital communications interface 56, which is coupled between the transmitter control circuitry 48 and a digital communications bus 58. The digital communications bus 58 is also coupled to the RF system control circuitry 42. As such, the RF system control circuitry 42 provides the envelope power supply control signal VRMP (FIG. 12) and the transmitter configuration signal PACS (FIG. 12) to the transmitter control circuitry 48 via the digital communications bus 58 and the digital communications interface 56.

Figure 14:
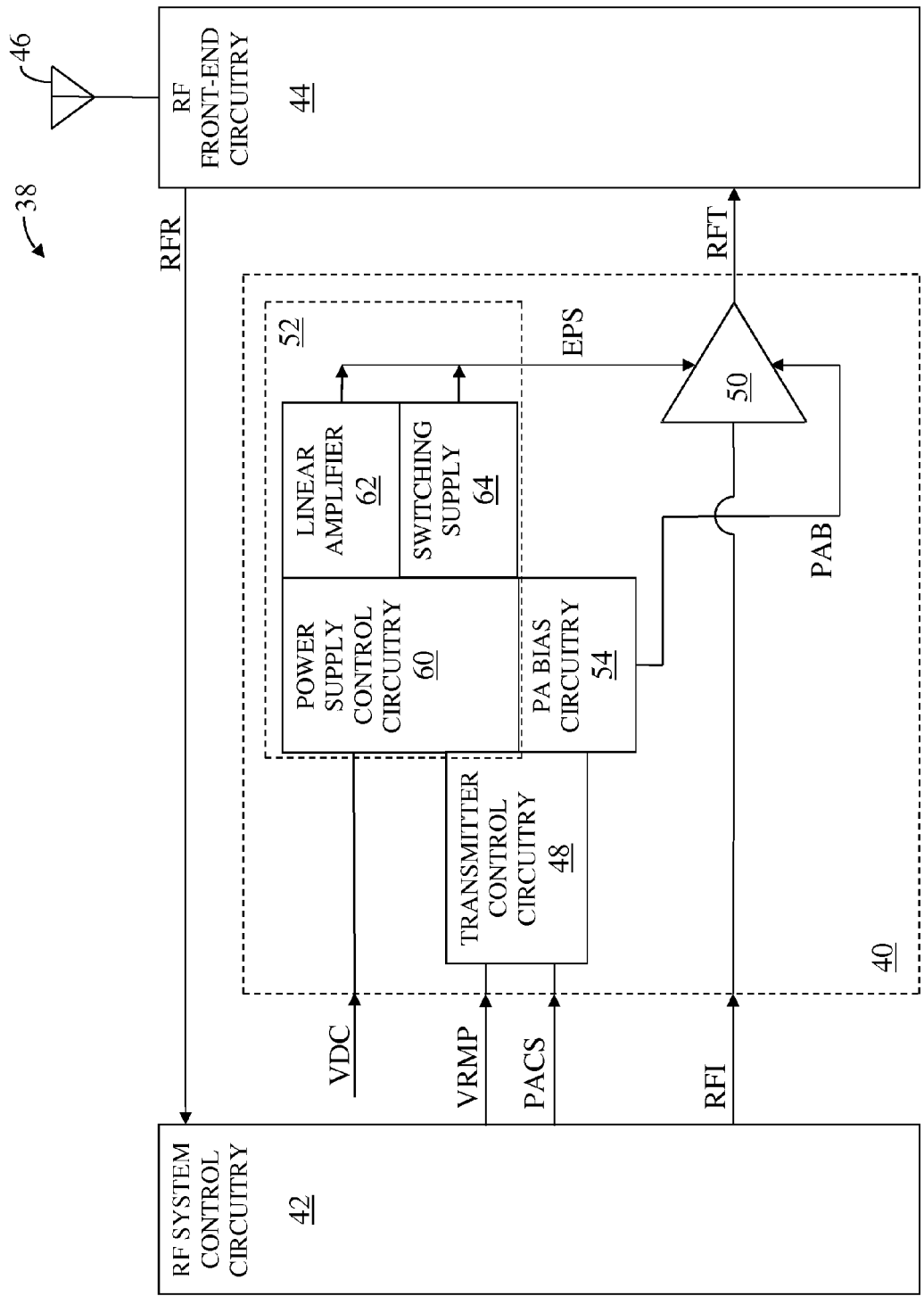
FIG. 14 shows details of an envelope tracking power supply illustrated in FIG. 1 according to one embodiment of the envelope tracking power supply.

FIG. 14 shows details of the envelope tracking power supply 52 illustrated in FIG. 12 according to one embodiment of the envelope tracking power supply 52. The envelope tracking power supply 52 includes power supply control circuitry 60, a linear amplifier 62, and a switching supply 64. The power supply control circuitry 60 is coupled to the transmitter control circuitry 48, the linear amplifier 62 is coupled to the power supply control circuitry 60, and the switching supply 64 is coupled to the power supply control circuitry 60. The transmitter control circuitry 48 may forward the envelope power supply control signal VRMP to the power supply control circuitry 60.

Since the envelope power supply control signal VRMP is representative of the setpoint of the envelope power supply signal EPS, the power supply control circuitry 60 controls the linear amplifier 62 and the switching supply 64 based on the setpoint of the envelope power supply signal EPS. The linear amplifier 62 and the switching supply 64 provide the envelope power supply signal EPS, such that the linear amplifier 62 partially provides the envelope power supply signal EPS and the switching supply 64 partially provides the envelope power supply signal EPS. The switching supply 64 may provide power more efficiently than the linear amplifier 62. However, the linear amplifier 62 may provide the envelope power supply signal EPS more accurately than the switching supply 64. As such, the linear amplifier 62 regulates a voltage of the envelope power supply signal EPS based on the setpoint of the envelope power supply signal EPS, and the switching supply 64 operates to drive an output current from the linear amplifier 62 toward zero to maximize efficiency. In this regard, the linear amplifier 62 behaves like a voltage source and the switching supply 64 behaves like a current source.

As previously mentioned, in one embodiment of the RF communications system 38, the RF PA 50 receives and amplifies the RF input signal RFI to provide the RF transmit signal RFT using the envelope power supply signal EPS, which provides power for amplification. In one embodiment of the RF input signal RFI, the RF input signal RFI is amplitude modulated. As such, the RF transmit signal RFT is also amplitude modulated. Since the amplitude of the RF transmit signal RFT is modulated, the amplitude of the RF transmit signal RFT traverses within an envelope of the RF transmit signal RFT. For proper operation of the RF PA 50, a voltage of the envelope power supply signal EPS must be high enough to accommodate the envelope of the RF transmit signal RFT. However, to increase efficiency in the RF PA 50, the voltage of the envelope power supply signal EPS may at least partially track the envelope of the RF transmit signal RFT. This tracking by the voltage of the envelope power supply signal EPS is called envelope tracking.

In this regard, since the envelope power supply control signal VRMP is representative of the setpoint of the envelope power supply signal EPS, the envelope power supply control signal VRMP may be received and amplitude modulated to provide at least partial envelope tracking of the RF transmit signal RFT by causing the envelope power supply signal EPS to be amplitude modulated. In one embodiment of the envelope power supply control signal VRMP, a bandwidth of the envelope power supply control signal VRMP is greater than about 10 megahertz. In an alternate embodiment of the envelope power supply control signal VRMP, the bandwidth of the envelope power supply control signal VRMP is less than about 10 megahertz.

Figure 15:
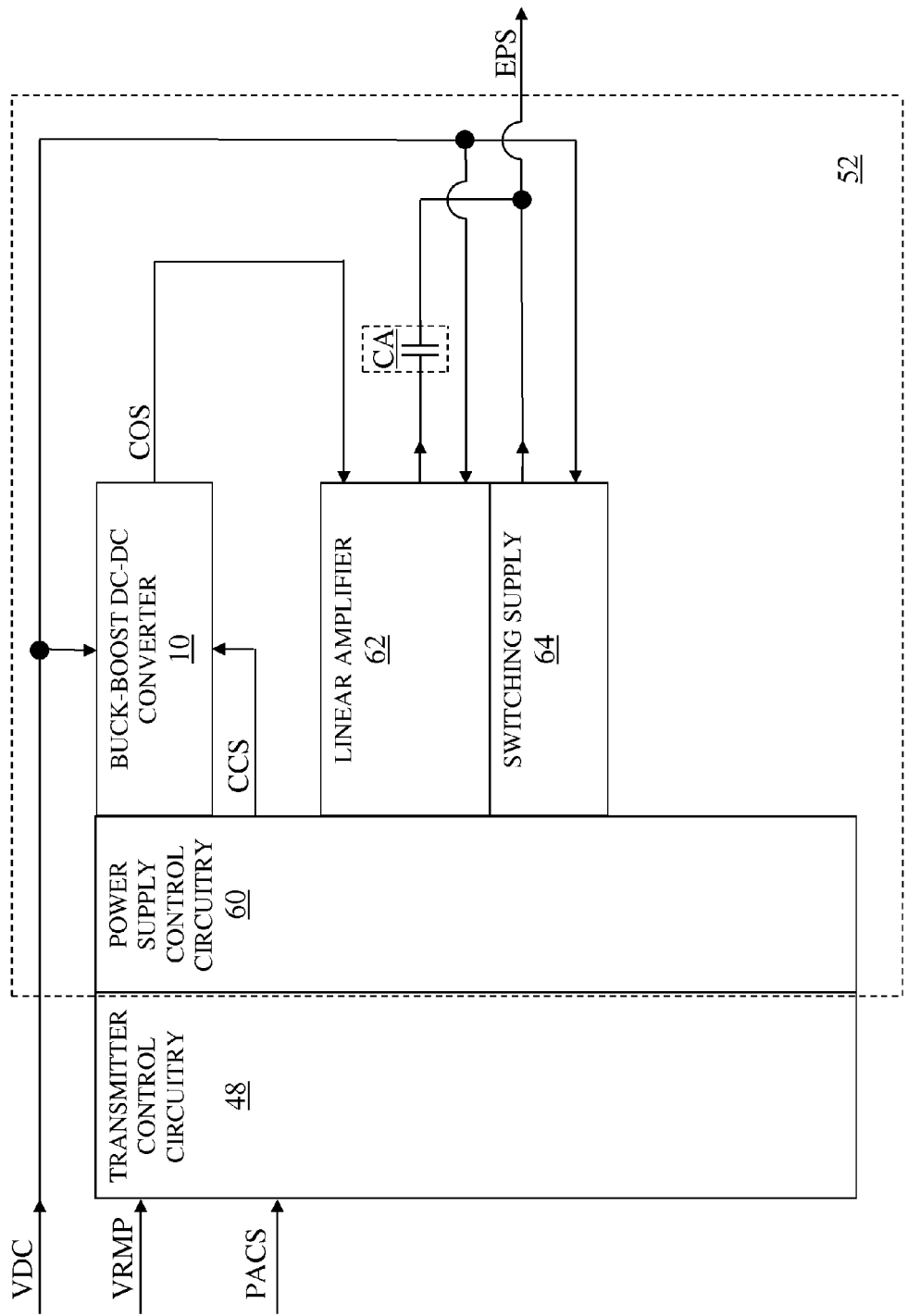
FIG. 15 shows details of the envelope tracking power supply illustrated in FIG. 1 according to an alternate embodiment of the envelope tracking power supply.

FIG. 15 shows details of the envelope tracking power supply 52 illustrated in FIG. 12 according to an alternate embodiment of the envelope tracking power supply 52. The envelope tracking power supply 52 illustrated in FIG. 15 is similar to the envelope tracking power supply 52 illustrated in FIG. 14, except the envelope tracking power supply 52 illustrated in FIG. 15 further includes the buck-boost DC-DC converter 10 and a linear amplifier offset capacitive element CA. The buck-boost DC-DC converter 10 is coupled to the power supply control circuitry 60 and to the switching supply 64, and the linear amplifier offset capacitive element CA is coupled between the linear amplifier 62 and the switching supply 64. As such, a series combination of the linear amplifier 62 and the linear amplifier offset capacitive element CA at least partially provides the envelope power supply signal EPS and the switching supply 64 at least partially provides the envelope power supply signal EPS directly.

The linear amplifier 62, the switching supply 64, and the buck-boost DC-DC converter 10 receive the DC source signal VDC. The power supply control circuitry 60 provides the converter configuration signal CCS to the buck-boost DC-DC converter 10. The buck-boost DC-DC converter 10 provides the converter output signal COS to the linear amplifier 62.

The linear amplifier 62 at least partially provides the envelope power supply signal EPS to the RF PA 50 (FIG. 14) using the converter output signal COS. The setpoint of the envelope power supply signal EPS is based on the desired voltage of the envelope power supply signal EPS. As such, the linear amplifier 62 regulates a voltage of the envelope power supply signal EPS based on the setpoint of the envelope power supply signal EPS.

During operation, the linear amplifier offset capacitive element CA may have an offset voltage. This offset voltage may allow the linear amplifier 62 to function properly even if a voltage of the envelope power supply signal EPS is greater than a voltage of the DC source signal VDC or greater than a voltage of the converter output signal COS. In an alternate embodiment of the envelope tracking power supply 52, the linear amplifier offset capacitive element CA is omitted. In one embodiment of the envelope tracking power supply 52, the switching supply 64 operates to drive an output current from the linear amplifier 62 toward zero to maximize efficiency.

Those skilled in the art will recognize improvements and modifications to the embodiments of the present disclosure. All such improvements and modifications are considered within the scope of the concepts disclosed herein and the claims that follow.

What is claimed is:

1. A buck-boost DC-DC converter configured to operate in both a buck mode and a boost mode, and comprising:
   converter control circuitry configured to provide a buck mode timing signal and a boost mode timing signal;
   converter switching circuitry configured to provide a switching output signal, wherein:
      during the buck mode, when a buck pulse-width of the switching output signal is less than a buck pulse-width threshold, the buck pulse-width is limited based on both the buck mode timing signal and the boost mode timing signal;
      during the boost mode, when a boost pulse-width of the switching output signal is less than a boost pulse-width threshold, the boost pulse-width is limited based on both the buck mode timing signal and the boost mode timing signal; and
   a first inductive element is configured to receive and filter the switching output signal to provide a converter output signal.

2. The buck-boost DC-DC converter of claim 1 further comprising a first capacitive element, wherein the first inductive element and the first capacitive element are coupled in series between the converter switching circuitry and ground to form a lowpass filter.

3. The buck-boost DC-DC converter of claim 1 wherein a DC power source is configured to provide a DC source signal to the converter control circuitry and the converter switching circuitry.

4. The buck-boost DC-DC converter of claim 3 wherein the converter control circuitry is further configured to select the one of the buck mode and the boost mode based on a DC source voltage of the DC source signal and a setpoint of a converter output voltage of the converter output signal.

5. The buck-boost DC-DC converter of claim 1 wherein the converter control circuitry is further configured to select the buck mode when a setpoint of a converter output voltage of the converter output signal is less than a DC source voltage, and select the boost mode when the setpoint of the converter output voltage is greater than the DC source voltage.

6. The buck-boost DC-DC converter of claim 1 wherein during the buck mode, when the buck pulse-width of the switching output signal is greater than the buck pulse-width threshold, the buck pulse-width is not limited based on the boost mode timing signal; and during the boost mode, when the boost pulse-width of the switching output signal is greater than the boost pulse-width threshold, the boost pulse-width is not limited based on the buck mode timing signal.

7. The buck-boost DC-DC converter of claim 1 wherein during the buck mode, the switching output signal toggles between being based on ground and being based on a DC source signal, such that a switching output voltage of the switching output signal toggles between nominally zero volts and nominally a DC source voltage of the DC source signal.

8. The buck-boost DC-DC converter of claim 1 further comprising a boost mode power supply configured to provide a boost supply signal having a boost supply voltage.

9. The buck-boost DC-DC converter of claim 8 wherein the boost mode power supply comprises a capacitor-based charge pump.

10. The buck-boost DC-DC converter of claim 8 wherein during the buck mode, the switching output signal toggles between being based on the boost supply signal and being based on ground, such that the boost supply voltage is nominally equal to a DC source voltage of a DC source signal. As such, a switching output voltage of the switching output signal toggles between nominally zero volts and nominally the DC source voltage.

11. The buck-boost DC-DC converter of claim 8 wherein during the boost mode, the switching output signal toggles between being based on the boost supply signal and being based on a DC source signal, such that the boost supply voltage is nominally equal to 1.5 times a DC source voltage of the DC source signal, wherein a switching output voltage of the switching output signal toggles between nominally the DC source voltage and nominally 1.5 times the DC source voltage.

12. The buck-boost DC-DC converter of claim 8 wherein during the boost mode, the switching output signal toggles between being based on the boost supply signal and being based on a DC source signal, such that the boost supply voltage is nominally equal to 2 times a DC source voltage of the DC source signal, wherein a switching output voltage of the switching output signal toggles between nominally the DC source voltage and nominally 2 times the DC source voltage.

13. The buck-boost DC-DC converter of claim 1 wherein a linear amplifier is configured to at least partially provide an envelope power supply signal to a radio frequency (RF) power amplifier (PA) using the converter output signal.

14. The buck-boost DC-DC converter of claim 13 wherein the linear amplifier is further configured to regulate a voltage of the envelope power supply signal based on a setpoint of the envelope power supply signal.

15. The buck-boost DC-DC converter of claim 14 wherein the envelope power supply signal is amplitude modulated to provide at least partial envelope tracking of an RF transmit signal from the RF PA.

16. The buck-boost DC-DC converter of claim 15 wherein a bandwidth of the envelope power supply signal is greater than 10 megahertz.

17. The buck-boost DC-DC converter of claim 13 wherein a switching supply is configured to at least partially provide the envelope power supply signal.

18. The buck-boost DC-DC converter of claim 13 wherein the RF PA is configured to receive and amplify an RF input signal to provide an RF transmit signal using the envelope power supply signal, which provides power for amplification.

19. The buck-boost DC-DC converter of claim 13 wherein the converter output signal is based on a maximum amplitude of the envelope power supply signal.

20. A method comprising:
operating a buck-boost DC-DC converter in both a buck mode and a boost mode;
providing a buck mode timing signal, a boost mode timing signal, and a switching output signal, wherein:
during the buck mode, when a buck pulse-width of the switching output signal is less than a buck pulse-width threshold, the buck pulse-width is limited based on both the buck mode timing signal and the boost mode timing signal; and
during the boost mode, when a boost pulse-width of the switching output signal is less than a boost pulse-width threshold, the boost pulse-width is limited based on both the buck mode timing signal and the boost mode timing signal; and
receiving and filtering the switching output signal to provide a converter output signal.

* * * * *